(12) United States Patent
Owa et al.

(10) Patent No.: US 7,050,149 B2
(45) Date of Patent: May 23, 2006

(54) EXPOSURE APPARATUS AND EXPOSURE METHOD

(75) Inventors: Soichi Owa, Kumagaya (JP); Naomasa Shiraishi, Saitama (JP); Takashi Aoki, Kawaski (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/008,631

(22) Filed: Dec. 10, 2004

(65) Prior Publication Data

US 2005/0157278 A1 Jul. 21, 2005

Related U.S. Application Data

(63) Continuation of application No. PCT/JP03/07398, filed on Jun. 11, 2003.

(30) Foreign Application Priority Data

Jun. 11, 2002 (JP) ............................ 2002-169496

(51) Int. Cl.
*G03B 27/53* (2006.01)

(52) U.S. Cl. ..................... 355/30; 355/53; 355/67; 355/71; 250/492.2; 250/548

(58) Field of Classification Search .................. 355/53, 355/67–71
See application file for complete search history.

(56) References Cited

U.S. PATENT DOCUMENTS

| 4,825,247 | A | 4/1989 | Kemi et al. ..................... 355/53 |
|---|---|---|---|
| 5,696,623 | A | 12/1997 | Fujie et al. .................. 359/350 |
| 5,883,704 | A | 3/1999 | Nishi et al. .................... 355/67 |
| 5,906,429 | A | 5/1999 | Mori et al. .................. 362/293 |
| 6,198,792 | B1 | 3/2001 | Kanouff et al. ........... 250/492.2 |
| 6,222,610 | B1 | 4/2001 | Hagiwara et al. .............. 355/53 |
| 6,252,648 | B1 | 6/2001 | Hase et al. ..................... 355/53 |
| 6,288,769 | B1 | 9/2001 | Akagawa et al. .............. 355/53 |
| 6,369,398 | B1 | 4/2002 | Gelernt ..................... 250/492.2 |
| 6,571,057 | B1 | 5/2003 | Aoki ........................... 355/67 |
| 6,791,766 | B1 | 9/2004 | Nishikawa ................... 359/811 |
| 2003/0011755 | A1* | 1/2003 | Omura et al. ................ 355/67 |
| 2004/0051984 | A1* | 3/2004 | Oshino et al. ............. 359/845 |

FOREIGN PATENT DOCUMENTS

| EP | 1030351 | * | 8/2000 |
|---|---|---|---|
| EP | 1 186 957 A2 | | 3/2002 |
| JP | A-08-045827 | | 2/1996 |
| JP | A-2000-306807 | | 11/2000 |
| WO | WO 00/48237 | | 8/2000 |
| WO | WO 11/48237 A1 | | 8/2000 |

* cited by examiner

*Primary Examiner*—D. Rutledge
(74) *Attorney, Agent, or Firm*—Oliff & Berridge PLC

(57) ABSTRACT

An exposure apparatus able to maintain reflectances of mirrors and transmittances of lenses and to maintain initial performance over a long period by using exposure light of a wavelength of the vacuum ultraviolet region to illuminate a mask and transfer images of patterns on the mask to a substrate, provided with a gas feed unit for supplying a light path space through which the exposure light passes with a gas mainly comprised of an inert gas or rare gas and introducing a predetermined concentration of hydrogen into the gas fed to at least part of the light path space.

33 Claims, 11 Drawing Sheets

EXPOSURE APPARATUS AND EXPOSURE METHOD

This is a Continuation of International Application No. PCT/JP03/07398 filed Jun. 11, 2003, which claims the benefit of Japanese Patent Application No. 2002-169496 filed Jun. 11, 2002. The entire disclosure of the prior application is hereby incorporated by reference herein in its entirety.

TECHNICAL FIELD

The present invention relates to an exposure apparatus and exposure method used when producing a semiconductor integrated circuit, liquid crystal display, thin film magnetic head, or other microdevice or a photomask etc. using photolithography.

BACKGROUND ART

When forming fine patterns of a semiconductor integrated circuit, liquid crystal display, or other electronic device, the method of reducing and transferring by exposure the patterns of a photomask (also called a "reticle") enlarging the patterns to be transferred 4- to 5-fold or so to a wafer or other substrate to be exposed using a projection exposure apparatus has been used.

The projection exposure apparatuses used for transfer have been shifting in exposure wavelength to the shorter exposure wavelength side so as to deal with the increasing fineness of semiconductor integrated circuits. At the present time, the mainstream wavelength is the 248 nm of KrF excimer laser, but the shorter wavelength 193 nm of ArF excimer laser is entering the commercial stage as well. Further, projection exposure apparatuses using shorter wavelength 157 nm of $F_2$ laser or wavelength 126 nm of $Ar_2$ laser or other light sources of the wavelength band called the "vacuum ultraviolet region" are also being developed.

A light beam of a wavelength of this vacuum ultraviolet region has an extremely large absorption due to oxygen or water vapor, hydrocarbon gas, etc. (hereinafter referred to as an "absorption gas"), so it is necessary to purge the light path through which exposure light passes of the oxygen or other absorption gas with a low absorption nitrogen or rare gas or other gas (hereinafter referred to as a "low absorption gas").

For example, regarding the concentration of oxygen or water vapor, it is necessary to keep the average concentration in the light path to not more than the ppm order. If the standard of the residual concentration of the absorption gas does not meet the above standard, the exposure energy on the wafer or other exposed substrate will become remarkably low.

Note that the glass material passing this vacuum ultraviolet light is limited to fluorite glass etc. Therefore, in a refraction optical system, correction of color aberration is difficult. As a projection optical system, an optical system comprised of reflection mirrors (concave mirrors) and lenses, that is, a catiodioptic optical system, is employed. In this optical system, flat mirrors are also necessary for separating light beams incident on the concave mirrors and light beams reflected from the concave mirrors.

These reflection mirrors or flat mirrors are required to have a high reflectance with respect to light beams in large ranges of incident angles, so employment of reflection mirrors or flat mirrors made by coatings including metal layers are considered promising.

In this wavelength region, as a metal layer having a high reflectance, aluminum etc. may be mentioned, but as explained above, there is the problem that if the gas-purged light path has even a little oxygen or water vapor remaining it in, the photochemical reaction caused by the irradiation of the vacuum ultraviolet light will cause this aluminum layer to be oxidized resulting in its reflectance sharply dropping.

Oxidation is not a problem that occurs only for mirrors including aluminum layers and is a problem which similarly occurs even if using another metal. Further, not only reflection mirrors and flat mirrors, but also antireflection coatings formed on the lens surfaces oxidize by the photochemical reaction with residual oxygen or water vapor and fall in transmittance.

Reduction of the residual oxygen and water vapor concentration in the purge gas is important in raising the transmittance of the exposure light passing through the light path. In particular, regarding water vapor, moisture adsorbed at the barrels or lens holding mechanisms forming the optical system continues to disassociate slowly over a long time, so it is difficult to suppress the concentration to not more than 1 ppm.

If the reflectance of the reflection mirrors or the transmittance of the antireflection coatings of the lens surfaces falls, the exposure energy reaching the wafer or other substrate to be exposed falls, so there is the problem that the processing ability of the exposure apparatus falls and the initial performance of the exposure apparatus can no longer be maintained.

Further, even if the above oxidation does not occur, it is not possible to produce mirrors with that high a reflectance in the vacuum ultraviolet region. The upper limit of the reflectance is not more than 90% or so. Therefore, part of the exposure light is absorbed by the mirrors and make the mirrors pick up heat. As a result, the mirrors are liable to deform due to heat expansion.

DISCLOSURE OF THE INVENTION

The present invention was made in consideration of this point and has as its object the realization of an exposure apparatus and exposure method able to maintain the reflectance of the reflection mirrors or the transmittance of the lenses included in an optical system in a good state and to maintain the initial performance over a long period even when using vacuum ultraviolet light as the exposure light.

Further, it enables the pickup of heat by the optical elements (mirrors, lenses, etc.) due to the exposure light to be prevented and stable optical performance to be exhibited over a long period.

To solve the above-mentioned problems, according to a first aspect of the present invention, there is provided an exposure apparatus using an exposure light beam to illuminate a mask and transferring an image of a pattern on the mask onto a substrate, the exposure apparatus having a gas feed unit for supplying a light path space through which the exposure light beam passes with a gas mainly comprised of an inert gas or rare gas and introducing into the gas supplied to at least part of the light path space a predetermined concentration of hydrogen.

In the exposure apparatus according to the first aspect of the present invention, when having an illumination optical system using the exposure light beam to illuminate the mask and a projection optical system for transferring the image of the pattern onto a substrate, the light path space is provided at one or both of the illumination optical system and the projection optical system. When one or both of the illumination optical system or the projection optical system has a reflection optical element for reflecting the exposure light, the space including the reflection optical element is particularly preferably supplied with the gas. Further, when at least one of the illumination optical system and/or the projection optical system has a mutually independent plurality of light path space, the gas feed unit can introduce into the gas fed to the plurality of light path space a predetermined concentration of hydrogen.

As the inert gas or rare gas, nitrogen gas, helium gas, neon gas, etc. may be mentioned. The gas preferably does not contain oxygen or water vapor. Further, as the concentration of the hydrogen, a partial pressure ratio of not more than 10% or so is preferable.

According to the present invention, by supplying gas containing hydrogen to part or all of the light path space, the reduction action of hydrogen suppresses the deterioration of the optical properties of the optical elements (mirrors or lenses etc.) in the light path (for example, the drop in reflectance or transmittance due to oxidation of mirror coatings including aluminum or another metal or anti-reflection coatings of the lens surfaces etc.), so good optical properties can be stably realized over a long period.

To solve the above-mentioned problems, according to a second aspect of the present invention, there is provided an exposure apparatus using an exposure light beam to illuminate a mask and transferring an image of a pattern on the mask onto a substrate, the exposure apparatus having a gas feed unit for supplying a light path space through which the exposure light beam passes with a gas mainly comprised of an inert gas or rare gas and a blowing unit for blowing the gas on a specific optical element among the plurality of optical elements arranged in the light path space. In this case, the blowing unit can form a flow for the optical element different from the flow of the gas due to the gas feed unit.

The gas may include a predetermined concentration of hydrogen. As the hydrogen concentration in this case, a partial pressure ratio of not more than 10% or so is desirable. As the inert gas or rare gas, nitrogen gas, helium gas, neon gas, etc. may be mentioned. The gas preferably does not include oxygen or water vapor.

According to the present invention, the optical element (mirror, lens, etc.) is blown with a gas, so the vicinities of the optical element is constantly supplied with fresh gas and therefore the water vapor produced from the surfaces of other structural materials (barrels, lenses, etc.) can be prevented from diffusing and depositing near the surfaces of the optical element. Therefore, oxidation of the optical element can be prevented. Further, if blowing temperature-controlled gas to the optical element, the optical element can also be controlled in temperature and the optical element can be kept from picking up heat. In this case, if employing helium gas as the gas, the high heat conductivity of helium gas enables the optical element picking up heat due to absorption of the exposure light beam to be efficiently cooled and enables the heat deformation of the optical element and the aberration arising due to the same to be prevented. If mixing hydrogen into this gas, the reduction action of hydrogen enables the oxidation of the optical element to be more strongly prevented.

The exposure apparatus according to the second aspect of the present invention may be further provided with a flow rectifying unit provided at a gas feed port of a blowing unit for slowing or making uniform the flow of gas blown from the gas feed port. If just locally blowing gas to an optical element, the surrounding outside ambient gas with a relatively high concentration of pollutants will end up being entrained in the flow of the gas (gas flow) and, while slight, the pollutants will end up reaching the surface of the optical element. Therefore, by the flow rectifying unit slowing or making uniform the flow of gas blown to the optical element, the entrainment of outside ambient air containing pollutants into the gas flow can be suppressed and the amount of pollutants reaching the surface of the optical element can be reduced. Due to this, contamination (oxidation) of the optical element surface can be further prevented and a deterioration of the optical properties of the optical element (drop in reflectance or transmittance or occurrence of unevenness) can be prevented.

The exposure apparatus according to the second aspect of the present invention may be further provided with an auxiliary blowing unit for feeding the gas so as to follow the flow of gas blown from a gas feed port of a blowing unit. With just simply locally blowing gas to the optical element, the surrounding outside ambient air with a relatively high concentration of pollutants ends up being entrained in the flow of the gas (gas flow) and, while slight, the pollutants may reach the surface of the optical element as explained above. Therefore, in the present invention, by feeding the flow of gas by the auxiliary blowing unit (hereinafter referred to as an "auxiliary gas flow") along the flow of gas by a blowing mechanism (hereinafter referred to as the "main gas flow"), entrainment of outside ambient air including pollutants to the main gas flow is suppressed and less pollutants reach the surface of the optical element. Due to this, contamination (oxidation) of the surface of the optical element can be further prevented and deterioration of the optical properties of the optical element (occurrence of drop or unevenness of reflectance or transmittance) can be prevented. In this case, it is possible to further provide a flow rectifying unit for slowing or making uniform the flow of gas fed from the gas feed port to at least one of the gas feed port of the blowing unit and/or gas feed port of the auxiliary blowing unit.

The exposure apparatus according to the second aspect of the present invention may be provided with a flow rectifying unit having a plate member attached around the periphery of the gas feed opening and facing the outside. Further, the exposure apparatus according to the second aspect of the present invention may use a flow rectifying unit having a substantially funnel-shaped duct part attached so that its downstream side flares open at the gas feed port.

The exposure apparatus according to the second aspect of the present invention may be provided with, when using the flow rectifying unit having the duct part, a shield plate so as to shield part of the opening of the duct part. The shape of the shield plate is selected in accordance with the shape of the optical element to which the gas is to be blown. When for example feeding gas along the reflection surface from the side of a mirror as the optical element, if providing a plate of a shape similar to the shape of the mirror side face, less of the gas will strike the side face of the mirror and cause turbulence and will flow uniformly along the reflection surface of the mirror, so entrainment of outside ambient air including pollutants can be reduced and contamination (oxidation) of the surface of the optical element can be more efficiently prevented.

The exposure apparatus according to the second aspect of the present invention may be provided with, when using the flow rectifying mechanism having the duct part, a plurality of diffusion plates (diffusers) for rectifying the flow of gas inside the duct part or may be provided at the opening of the duct part with a mesh plate or a porous plate having a plurality of through holes. The flow of gas supplied to an optical element is further slowed or made more uniform and entrainment of outside ambient air containing pollutants is further reduced. It is also possible to provide the opening of the duct part with a cleaning filter plate (particle filter etc.) and possible to feed a cleaner purge gas and reduce deposition of pollutants on the surface of the optical element.

The exposure apparatus according to the second aspect of the present invention preferably uses as the gas a gas mainly comprised of an inert gas or rare gas (for example, nitrogen gas, helium gas, neon gas, etc.) Further, the gas may contain a predetermined concentration of hydrogen. The concentration of the hydrogen gas in this case is preferably a partial pressure ratio of not more than 10% or so. Further, the gas preferably does not contain oxygen and water vapor.

The exposure apparatus according to the second aspect of the present invention preferably feeds the gas to a reflection optical element provided to at least one of the illumination optical system using the exposure light to illuminate the mask and the projection optical system transferring the image of the pattern onto the substrate. Such a reflection optical element is oxidized at its reflection surface by moisture or other pollutants and becomes uneven in reflectance in some cases. This can be suppressed with a high efficiency.

Further, the exposure apparatus according to the second aspect of the present invention maybe provided with a plurality of gas feed ports of the blowing unit facing the optical element. The flows of gas blown from the gas feed ports will collide with or affect each other at the substantial center of the optical element and head in a direction away from the optical element, so less pollutants will reach the optical element.

Further, the exposure apparatus according to the second aspect of the present invention may be provided with an exhaust unit having a gas exhaust port at a position substantially symmetric with the gas feed port of the blowing unit across the optical element. The gas blown from the feed port to the optical element is positively exhausted from the exhaust port, so the gas flows smoothly and causes less turbulence, so there is less entrainment of outside ambient air containing pollutants and less pollutants reaching the optical element.

To solve the above-mentioned problem, according to a third aspect of the present invention, there is provided an exposure apparatus for using an exposure light beam to illuminate a mask and transferring an image of a pattern on the mask onto a substrate, the exposure apparatus having a partition member partitioning the light path space through which the exposure light beam passes into a first space including a reflection optical element and a second space not including the reflection optical element, a first gas feed unit which is connected to the first space and feeds to the first space a first gas mainly comprised of an inert gas or rare gas and a second gas feed unit which is connected to the second space and feeds to the second space a second gas different from the first gas.

In this case, the feed amount of the first gas to the first space and the feed amount of the second gas to the second space may be made different. Further, the main ingredients of the first gas and the second gas may be made different. Further, the first gas may include a predetermined concentration of hydrogen. As the hydrogen concentration in this case, a partial pressure ratio of not more than 10% or so is preferable. As the first gas and/or second gas, nitrogen gas, helium gas, neon gas, etc. may be mentioned. These gases preferably do not include oxygen and water vapor.

According to the present invention, the first space including the reflection optical element and the second space not including the reflection optical element are fed gases separately. In particular, since the first space including the oxidation-susceptible reflection optical element and the second space not including the optical element are separated, the ability to feed gas to the first space can be strengthened. Residual water vapor is produced from the surfaces of the structures forming the light path space (barrels, lenses, etc.), so the residual water vapor concentration is proportional to the surface area and inversely proportional to the flow amount of the flowing gas. Therefore, by minimizing the space including the reflection optical element and sending a large amount of gas to that part, it is possible to further reduce the water vapor concentration of the space including the reflection optical element.

To solve the above-mentioned problems, according to a fourth aspect of the present invention, there is provided an exposure method using an exposure light beam to illuminate a mask and transferring an image of a pattern on the mask onto a substrate, the exposure method comprising feeding a light path space through which the exposure light beam passes a gas mainly comprised of an inert gas or rare gas and including in the gas fed to at least part of the light path space a predetermined concentration of hydrogen. It is possible to achieve actions and effects similar to the exposure apparatus according to the first aspect.

To solve the above-mentioned problem, according to a fifth aspect of the present invention, there is provided an exposure method using an exposure light beam to illuminate a mask and transferring a pattern on the mask onto a substrate, the exposure method comprising feeding a light path space through which the exposure light beam passes a gas mainly comprised of an inert gas or rare gas and blowing the gas to optical element having a metal layer among a plurality of optical elements arranged in the light path space. It is possible to achieve actions and effects similar to the exposure apparatus according to the second aspect.

To solve the above-mentioned problem, according to a sixth aspect of the present invention, there is provided an exposure method using an exposure light beam to illuminate a mask and transferring a pattern on the mask on to a substrate, the exposure method comprising partitioning a light path space through which the exposure light beam passes into a first space including a reflection optical element and a second space not including the reflection optical element, feeding the first space a first gas mainly comprised of an inert gas or rare gas, and feeding the second space a second gas different from the first gas. It is possible to achieve actions and effects similar to the exposure apparatus according to the third aspect.

To solve the above-mentioned problems, according to a seventh aspect of the present invention, there is provided an exposure method using an exposure light beam to illuminate a mask and transferring a pattern on the mask onto a substrate, the exposure method comprising exposing the substrate while blowing gas in a region broader than the part of at least an optical element arranged on a path of the exposure light through which the exposure light beam passes. With the present invention, since the substrate is exposed while blowing gas to the optical element, patterns can be transferred in the state where the surface of the optical element is kept clean by the gas, that is, in the state where the optical properties of the optical element are good, and the exposure accuracy can be improved.

To solve the above-mentioned problems, according to an eighth aspect of the present invention, there is provided a method of production of an electronic device including a lithography step, the lithography step using an exposure apparatus according to any one of the first to third aspects of the present invention to transfer a pattern formed on a mask to a substrate. The exposure apparatus of the present invention has little contamination of the surfaces of the optical element, so it is possible to produce good quality electronic devices.

Note that, the exposure apparatus or exposure method of the present invention is particularly preferable when using exposure light of a wavelength of the vacuum ultraviolet region in the range of wavelength of 120 nm to 195 nm.

BEST MODE FOR WORKING THE INVENTION

Figure 1:
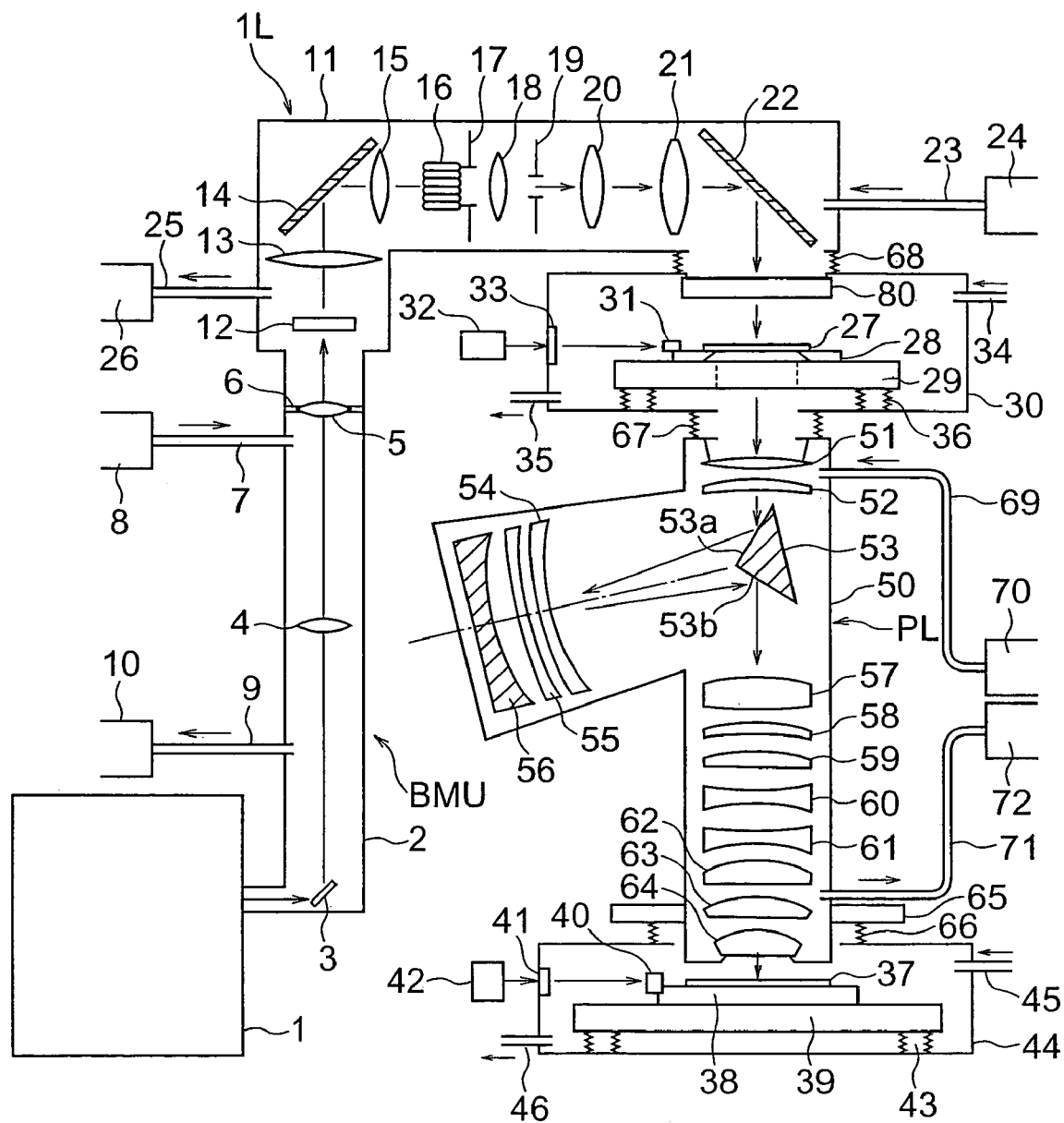
FIG. 1 is a view of the overall configuration of a projection exposure apparatus according to a first embodiment of the present invention.

Below, embodiments of the present invention will be explained using the drawings. FIG. 1 is a view of the general configuration of an exposure apparatus according to a first embodiment of the present invention. This exposure apparatus is a step-and-scan type (scan type) projection exposure apparatus. A light beam emitted from a wavelength 157 nm fluorine laser ($F_2$ laser), wavelength 146 nm krypton dimer laser ($Kr_2$ excimer laser), wavelength 126 nm argon dimer laser ($Ar_2$ excimer laser), or other vacuum ultraviolet region light source 1 is irradiated through a beam matching unit (however, in the broad sense, part of an illumination optical system) BMU and an illumination optical system IL to a mask 27, whereby patterns on the mask 27 are projected by a projection optical system PL on a wafer 37.

The beam matching unit BMU is comprised of a bending mirror 3 and relay lenses 4, 5 housed in a BMU chamber 2. The illumination light beam is guided to a diffraction optical element 12 housed in an illumination system chamber 11. The light beam emitted from the diffraction optical element 12 passes through a relay lens 13, bending mirror 14, and relay lens 15 and becomes the light beam incident to an optical integrator (homogenizer) constituted by a fly-eye lens 16. Here, instead of using the fly-eye lens 16, it is also possible to use a rod integrator (inside surface reflection type integrator) or a diffraction optical element etc. Note that two fly-eye lenses 16 may also be provided in series so as to further improve the uniformity of the illumination distribution.

The emission side of the fly eye lens 16 is provided with an aperture stop system 17. The aperture stop system 17 is provided with a circular aperture stop for ordinary illumination, an aperture stop for modified illumination comprised of a plurality of off-axis apertures, an aperture stop for ring illumination, etc. freely switchable. Note that as the diffraction optical element 12, a phase type diffraction grating having a shape enabling the illumination light beam to be efficiently converged for the modified illumination or other illumination conditions is used.

The light beam passing through the aperture stop system 17 passes through the relay lens group 18, field stop 19, relay lens group 20, 21, and bending mirror 22 and illuminates the mask 27.

The mask 27 is held on the mask stage 28 by a vacuum suction mechanism etc. The mask stage 28 is designed to be able to scan a mask table 29, provided on a not shown column through a dampening device 36, in the left-right directions of the paper sheet. The position of the mask 27 is found by measurement of the position of a moving mirror 31 provided on the mask stage 28 by a laser interferometer 32 provided facing the moving mirror 31. Further, the mask table 29 is surrounded by a highly air-tight partition wall to form a mask stage chamber 30. The measurement light of the laser interferometer 32 passes through a glass window 33 to enter inside the mask stage chamber 30.

Note that the above beam matching unit BMU and illumination optical system IL are housed in the BMU chamber 2 and illumination system chamber 11 provided with the highly air-tight partition walls, so are isolated from the outside space. The BMU chamber 2 and illumination system chamber 11 are separated in inside space (light path space) by the relay lens 5 and its support member 6. The aperture of the mask 27 side end of the illumination system chamber 11 is sealed air-tightly by a transparent plate 80. The relay lens 5 and support member 6 are configured in the same way as a seal member 191 and support member 192 of the later explained second embodiment.

The light beam passing through the mask 27 is imaged by the projection optical system PL housed in the barrel 50 and forms images of the patterns of the mask 27 on the wafer 37. The light beam emitted from the mask 27, in the projection optical system 50, passes through the lenses 51, 52 and is reflected at an upper reflection surface 53a of a V-block type mirror 53 with a reflection surface formed into a V-shape in cross-section (pent-roof type flat mirror). Next, the light beam passing through lenses 54, 55 and reflected at a concave mirror 56 again passes through the lenses 54, 55 and is reflected at a lower reflection surface 53b of the V-block type mirror 53. Further, it passes through lenses 57 to 64 and reaches the wafer 37. The barrel 50 of the projection optical system PL is also structured air-tightly. The space (light path space) surrounded by the lens 51 closest to the mask 27, the lens 64 closest to the wafer 37, and the barrel 50 is sealed air-tightly from the outside. Instead of the V-block type mirror 53, it is also possible to combine two flat mirrors to form the mirror 53.

The wafer 37 is held on a wafer stage 38. The wafer stage 38 can scan and move in the left-right direction and the depth direction of the paper sheet on a wafer table 39 provided on a not shown column or base plate through a dampening device 43. The position of the wafer 37 is found by measuring the position of a moving mirror 40 provided on the wafer stage 38 by a laser interferometer 42 provided facing the moving mirror 40. Further, the wafer table 39 is surrounded by a highly air-tight partition wall to form a wafer stage chamber 44. The measurement light of the laser interferometer 42 passes through a glass window 41 and enters inside the wafer stage chamber 44.

As explained above, when using light of a wavelength of the vacuum ultraviolet region in the range of the wavelength 120 nm to 195 nm as the exposure light beam, it is necessary to remove from the light path any oxygen, water vapor, hydrocarbon-based gas, or other gas (absorption gas) having a strong absorption with respect to light in the vacuum ultraviolet region.

Therefore, in the present embodiment, the space of the light path of the exposure light beam and its vicinity (light path space) of the BMU chamber 2, illumination system chamber 11 of the illumination optical system IL, mask stage chamber 30, barrel 50 of the projection optical system PL, and wafer stage chamber 44 are designed to be substantially air-tight with respect to the outside. Further, the joints of the parts 2, 11, 30, 50, and 44 are also designed to be air-tight.

That is, the joint of the BMU chamber 2 and illumination system chamber 11 is made air-tight by using an O-ring or other sealing member (not shown). However, the joint of the mask stage chamber 30 and illumination system chamber 11, the joint of the mask stage chamber 30 and barrel 50, and the joint of the wafer stage chamber 44 and barrel 50 preferably do not use an O-ring or other sealing member like this. At the time of exposure of the wafer 37, the mask 27 and mask stage 28 and the wafer 37 and wafer stage 38 are simultaneously scanned for scan exposure, so the mask stage chamber 30 and wafer stage chamber 44 are liable to vibrate along with this scan operation. Therefore, if completely coupling the stage chambers 30, 44 and illumination system chamber 11 and barrel 50, the vibration would be transmitted to them and the imaging performance would be liable to be degraded.

Therefore, in this embodiment, the air-tightness between the two stage chambers 30, 44 and the illumination system chamber 11 and barrel 50 is secured by film members 66, 67, 68. The film member 66 is connected to both a blade-shaped member 65 provided to project from the outer circumference of the barrel 50 and the wafer stage chamber 44 and seals the two air-tightly. The film member 67 is connected to both the top end of the barrel 50 and the mask stage chamber 30 and air-tightly seals the space between them. The film member 68 is connected to both the bottom end of the illumination optical system 11 and the top of the mask stage chamber 30 and makes the space between them air-tight. As each film member, a film material comprised of an ethylene vinyl alcohol resin (EVOH resin) covered on its outer surface through an adhesive with a protective film with a good elasticity comprised of polyethylene and having aluminum vapor deposited on its inner surface is preferably used. Note that this member is not limited so long as escape of gas from the film member is suppressed. Further, each film member may be formed in an accordion shape.

In this embodiment of the exposure apparatus, to exhaust the absorption gas from the air-tightly sealed space, gas purging mechanisms filled with a gas with a low absorption of the vacuum ultraviolet region such as nitrogen or helium, argon or neon or another rare gas (low absorption gas) are provided.

The gas purging mechanisms are provided corresponding to the different units (BMU chamber 2, illumination system chamber 11, mask stage chamber 30, barrel 50, wafer stage chamber 44). The gas purging mechanisms are provided with gas feed pipes 7, 23, 34, 69, 45 connected at first ends to the units 2, 11, 30, 50, 44 so as to feed the corresponding units 2, 11, 30, 50, 44 with purge gas constituted by the low absorption gas and with exhaust pipes 9, 25, 35, 71, 46 connected at first ends to the units 2, 11, 30, 50, 44 so as to exhaust the gas in the units 2, 11, 30, 50, 44.

Further, the gas purging mechanisms are also provided with low absorption gas feeders 8, 24, 70 (partially not shown) connected to other ends of the gas feed pipes 7, 23, 34, 69, 45 and gas exhausters 10, 26, 72 (partially not shown) connected to the other ends of the exhaust pipes 9, 25, 35, 71, 46. The low absorption gas feeders 8, 24, 70 etc. and gas exhausters 10, 26, 72, etc. are suitably operated so that gas in the units 2, 11, 30, 50, 44 is exhausted and new low absorption gas is simultaneously fed, whereby the gas in the units 2, 11, 30, 50, 44 is purged by the low absorption gas.

In this embodiment, the insides of the units 2, 11, 50 are purged with low absorption gas having an oxygen and water vapor concentration of not more than 0.1 ppm, but as explained above, oxygen invades the light path space in the units 2, 11, 50 due to leaks caused by imperfect air-tightness. Further, water vapor invades the light path space due to leaks and disassociation (evaporation) of moisture adsorbed on the inside walls of the barrels or chambers defining the light path space or the surfaces of the lenses or mirrors. Therefore, the concentration of the absorption gas (oxygen or water vapor) in the light path space unavoidably becomes higher than the concentration contained in the low absorption gas.

However, if the light path space of the exposure apparatus using vacuum ultraviolet light as the light source include oxygen or water vapor, that oxygen or water vapor undergoes a photochemical reaction producing radical oxygen due to the energy of the vacuum ultraviolet light, whereby anti-reflection coatings including metal layers used for the surfaces of mirrors of the optical systems IL, PL or the anti-reflection coatings mainly comprised of a metal fluoride used for the surfaces of the lenses are oxidized and a drop in reflectance of the mirrors or transmittance of the lenses is caused.

Therefore, in the exposure apparatus of this embodiment, the low absorption gas fed to the inside of the BMU chamber 2 and illumination system chamber 11 and barrel 50 is made to include hydrogen gas of a partial pressure ratio of not more than 10% or so in order to prevent oxidation of the mirrors and anti-reflection coatings due to the reduction action of this hydrogen gas.

The inside of the BMU chamber 2 is fed with nitrogen gas containing 8% of hydrogen through the gas feed pipe 7 from the low absorption gas feeder 8. The inside of the illumination system chamber 11 is fed with nitrogen gas containing 10% hydrogen through the gas feed pipe 23 from the low absorption gas feeder 24. Further, the barrel 50 is fed with helium gas containing 8% of hydrogen through the gas feed pipe 69 from the low absorption gas feeder 70. Hydrogen is a gas with a small absorption of vacuum ultraviolet light, so in terms of optical performance, the content of hydrogen should be higher than 10%, but hydrogen is a gas requiring caution in handling, so for safety, it is preferable that its concentration not be made higher than 10%.

The gas purging the inside of the barrel 50 is mainly made helium to prevent heat pickup of the mirrors 53, 56 due to absorption of exposure light and the accompanying heat deformation. By using the high heat conductivity helium, the mirrors 53, 56 can also be cooled.

Therefore, if the reflectances of the mirrors 53, 56 are sufficiently high, the absorption of exposure light is small, the picked up heat is also small, etc. and therefore positive cooling of the mirrors 53, 56 is not necessary, it is also possible to make the main ingredient of the gas purging the inside of the barrel 50 a rare gas or nitrogen. However, in this case, with nitrogen or a rare gas other than helium and hydrogen, since their refractive indexes greatly differ, it is necessary to use the low absorption gas feeder 70 to control the composition ratio of gas on the ppm order. Alternatively, it is preferable to measure the composition ratio of nitrogen and hydrogen and, based on the results, drive a predetermined optical member (lens or mirror) in the projection optical system PL to compensate for the fluctuations in the refractive index.

When making the main ingredient of the gas purging the inside of the barrel 50 of the projection optical system PL helium, since the refractive indexes of hydrogen and helium are substantially the same, the fluctuation in the optical performance accompanying fluctuation in the gas composition is small, but to realize a higher performance optical system, it is better to provide a mechanism which controls the composition in the same way as above or measures the composition and controls movement of predetermined optical members (lenses or mirrors) in the projection optical system PL.

The main ingredient of the gas purging the inside of the BMU chamber 2 and illumination system chamber 11 is made nitrogen because nitrogen is cheaper than a rare gas and the running costs of the apparatus are therefore better. If the optical components of the BMU chamber 2 and illumination system chamber 11 also have to be positively cooled, it is also possible to make the main ingredient of the gas purging its inside helium.

Note that it is also possible to exhaust the gas in the units 2, 11, 50 through the exhaust pipes 9, 25, 71 to the gas exhausters 10, 26, 72, use filters etc. to remove the oxygen or water vapor and control the gas to a predetermined temperature, then again send the gas to the gas feeders 8, 24, 70 and again feed it to the units 2, 11, 50. Further, in the first embodiment, the inside of the illumination system chamber 11 and the inside of the barrel 50 form a single light path space, but it is also possible to divide the inside of the illumination system chamber 11 and the inside of the barrel 50 into pluralities of light path space. When dividing them into pluralities of light path space, each light path space is provided with a low absorption gas feeder and gas exhauster. Further, when dividing them into pluralities of light path space, it is also possible to make the contents of the hydrogen in the low absorption gas supplied to the space different. For example, it is possible to make the content of hydrogen in the low absorption gas supplied to a light path space where the mirrors are arranged and the content of hydrogen in the low absorption gas supplied to a light path space where the lenses are arranged different.

The inside of the mask stage chamber 30 or wafer stage chamber 44 has few lenses or mirrors passing and reflecting vacuum ultraviolet light, so pure nitrogen or a rare gas is used to purge the gas. This is done by feeding low absorption gas from the gas feed pipes 34, 45 and exhausting the inside gas from the exhaust pipes 35, 46.

Figure 2:
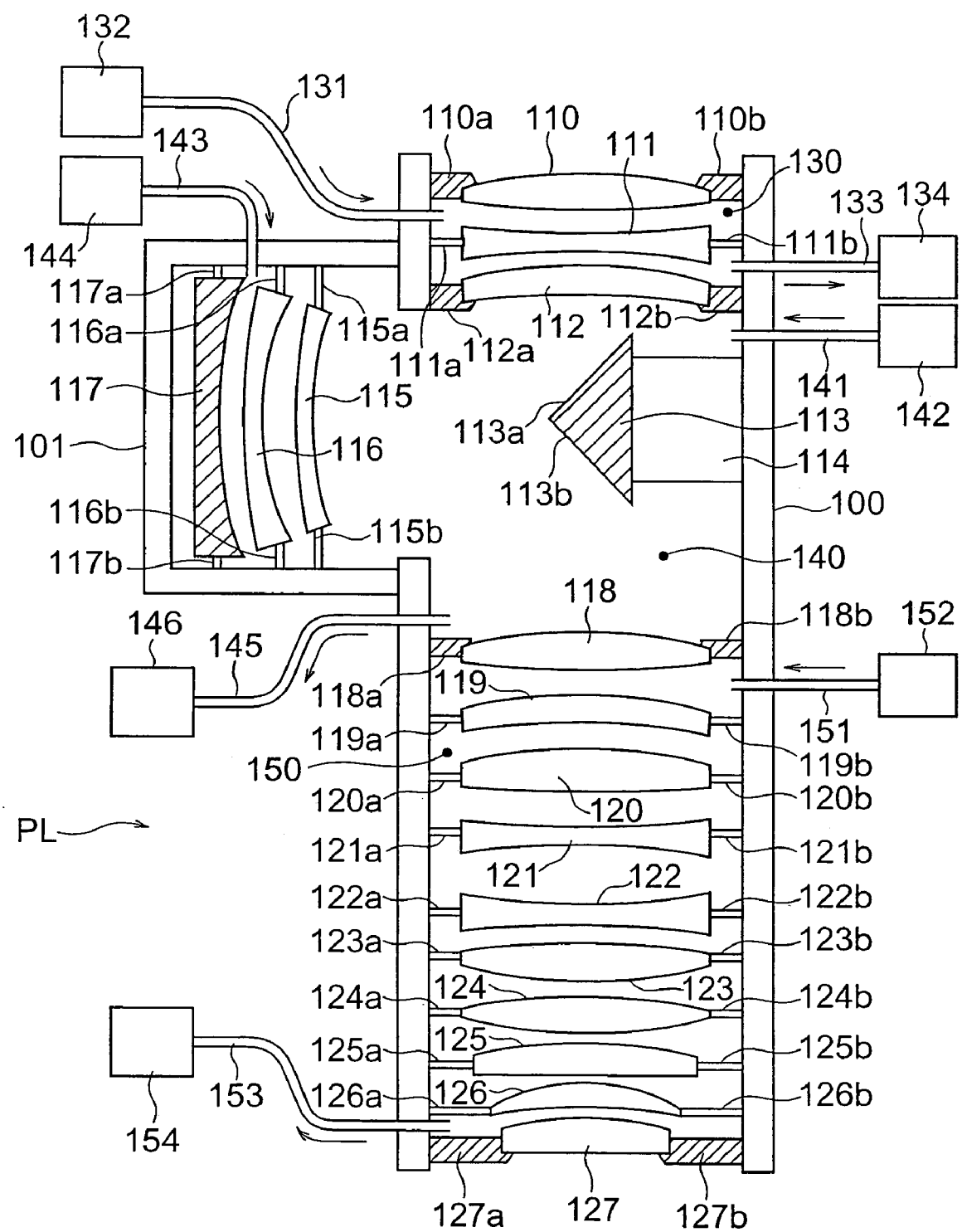
FIG. 2 is a view of the overall configuration of a projection exposure apparatus according to a second embodiment of the present invention.

Next, a second embodiment of the present invention will be explained using FIG. 2. FIG. 2 is a view of the configuration of a projection optical system employed in the second embodiment of the projection exposure apparatus according to the present invention. The basic configuration is similar to the projection optical system PL according to the first embodiment shown in FIG. 1.

The projection optical system PL is housed in a first barrel 100 and a second barrel 101. The side part of the first barrel 100 is formed with an opening. Through this opening, the second barrel 101 is attached horizontally in a manner so that their inside space communicate with each other. The front end of the second barrel is closed.

The opening at the mask side end of the first barrel 100 is closed air-tightly by a lens 110 and its holding mechanisms 110*a*, 110*b*. The opening at the wafer side end is closed air-tightly by a lens 127 and its holding mechanisms 127*a*, 127*b*. Further, inside the first barrel 100, the part above the opening to the second barrel 101 is closed air-tightly by a lens 112 and its holding mechanisms 112*a*, 112*b*. The part below the opening is closed by a lens 118 and its holding mechanisms 118*a*, 118*b*. Due to this, the insides of the barrels 100, 101 define three space 130, 140, 150.

Figure 5:
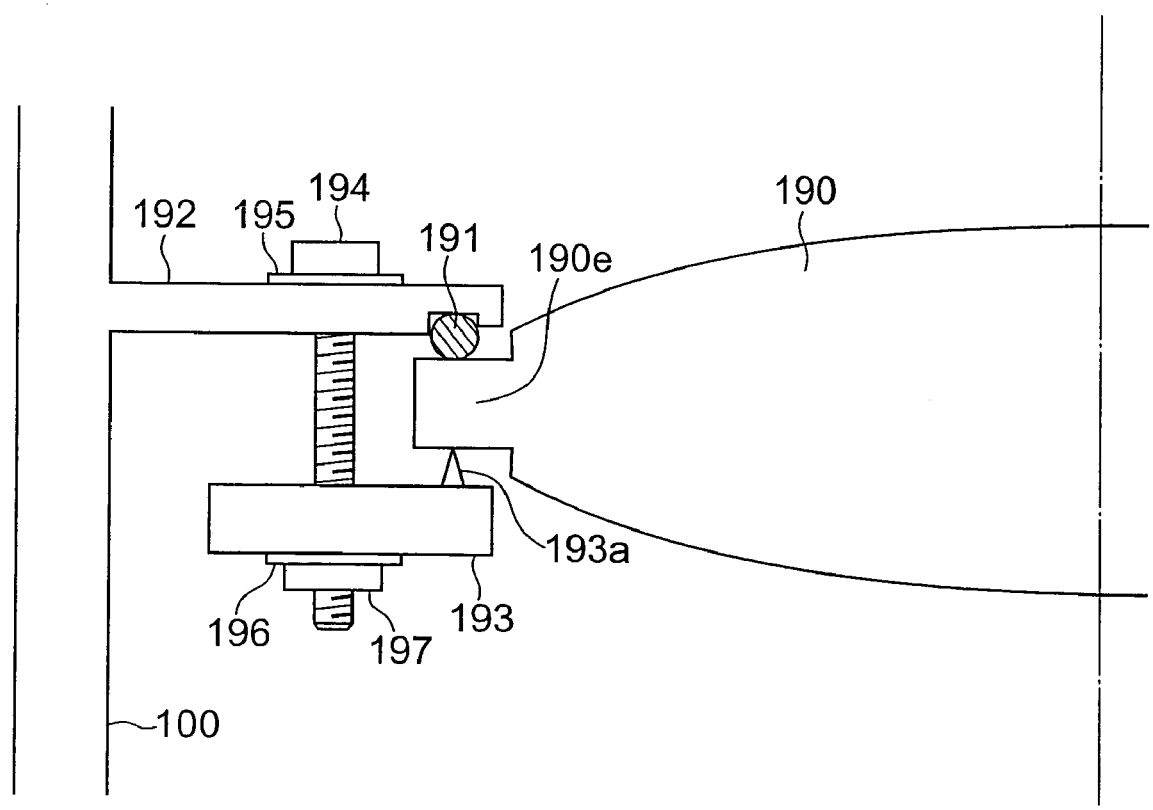
FIG. 5 is a view of a holding mechanism of a lens of an embodiment of the present invention.

Note that the lenses 110, 127, 112, 118 and the structures of their support mechanisms 110*a*, 110*b*, 127*a*, 127*b*, 112*a*, 112*b*, 118*a*, 118*b* are structures such as illustrated in FIG. 5. At the peripheral end of each lens (190 in FIG. 5), a ring-shaped flat part 190*e* is formed. One surface of this flat part 190*e* contacts the support member 192 extending from the barrel 100 through an O-ring or other seal member 191. Further, a second holding member 193 is fixed by a bolt 194, nut 197 and washers 195, 196 to a support member 192. A projection 193*a* provided near the front end of the second holding member 193 presses against the other surface of the flat part 190*e*. The seal member 191 and support member 192 also surround the lens 190 in a ring shape. Due to this, the air-tightness above and below the lens 190 is secured.

The space 130 in the barrels 100, 101 is provided with a lens 111 through the holding mechanisms 111*a*, 111*b*. The space 150 is provided with a plurality of lenses 119 to 126 through the corresponding holding mechanisms 118*a* to 126*a*, 118*b* to 126*b*. The first barrel 100 side of the space 140 is provided with a V-block type mirror 113 having an upper reflection surface 113*a* and a lower reflection surface 113*b* through a support member 114, while the second barrel 101 is provided with lenses 115, 116 and a concave mirror 117 through the holding mechanisms 115*a* to 117*a*, 115*b* to 117*b*.

In the present embodiment, the space inside the barrels 100, 101 is divided into a space 140 including the mirror 113 and mirror 117 and other space 130 and 150. Further, the space 140 including the mirrors 113, 117 is fed helium from the low absorption gas feeder 142 and gas feed pipe 141 and the low absorption gas feeder 144 and gas feed pipe 143 and purged inside with helium. On the other hand, the other space 130, 150 are also fed helium from the gas feeders 132, 152 and gas feed pipes 131, 151 and purged inside by helium. The gas in the space 130, 140, 150 is exhausted by the exhaust pipes 145, 133, 153 and gas exhausters 146, 134, 154.

At this time, the flow amount of feed of helium gas with respect to the surface areas of the space 130, 140, 150 is set high at the space 140 including the mirrors 113, 117 and set low in the other space 130, 150. Specifically, in the space 140 including the mirrors 113, 117, the amount of feed of helium per 1 $m^2$ of the inside surface area is made 5 liter/min or so, while in the other space 130, 150, the amount of feed of helium per 1 $m^2$ of the inside surface area is made 1 liter/min or so.

Due to this, it is possible to reduce the water vapor concentration in particular in the space 140 including the oxidation-susceptible mirrors 113 (113a, and 113b), 117 and possible to prevent oxidation of the mirrors 113, 117 and the flow amount of helium in the other space can be suppressed to reduce the running costs of the apparatus. Further, in the space 140 including the mirrors 113, 117, helium gas is fed from near the mirrors 113, 117 through the gas feed pipes 141, 143, so the vicinities of the mirrors 113, 117 can be reduced in water vapor concentration compared with other regions in the space 140.

Further, when there is no need to particularly cool the lens members 110 to 112, 118 to 127 in the other space 130, 150, the purge gas is made nitrogen to further reduce the running costs.

Note that, in the present embodiment as well, about 10% or less of hydrogen can be mixed into the helium or nitrogen purging the gas in the barrels 100, 101 to more strongly prevent oxidation of the mirrors (high reflectance coatings) or anti-reflection coatings.

As in the present embodiment, subdividing the inside space of the barrels 100, 101 of the projection optical system and making the flow amount or type of the low absorption gas fed to the space 140 to the space including the mirrors 113, 117 different from the gas fed to the space 130, 150 may also be applied to the space including the mirrors of the chamber 11 of the illumination optical system IL and the chamber 2 of the beam matching unit BMU and other space.

Figure 3:
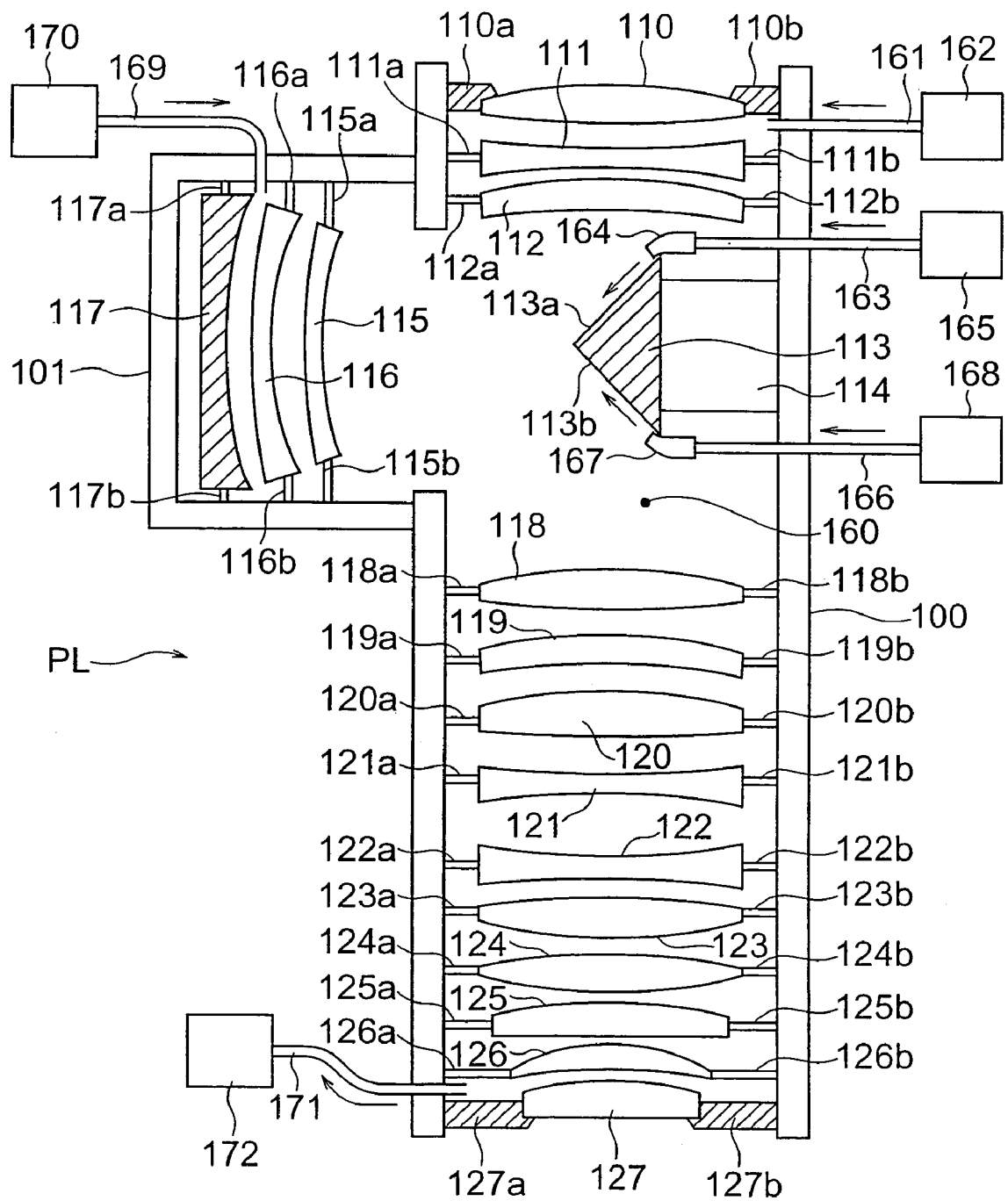
FIG. 3 is a view of the overall configuration of a projection exposure apparatus according to a third embodiment of the present invention.

Next, a third embodiment of the present invention will be explained using FIG. 3. FIG. 3 is a view of a projection optical system employed in the projection exposure apparatus according to the present invention. Its configuration is substantially the same as the projection optical system PL of the second embodiment shown in FIG. 2, so its explanation will be omitted. However, in the third embodiment, the inside of the projection optical system PL is not subdivided and forms a single air-tight space 160.

A gas purging mechanism is provided for feeding the space 160 in the barrels 100, 101 with helium from the gas feeder 162 and gas feed pipe 161 and exhausting the gas in the space 160 from the exhaust pipe 171 and gas exhauster 172.

Further, as the gas blowing mechanism for locally blowing a low absorption gas on the surface of the mirror 113 (reflection surfaces 113a, 113b) as a specific optical element, the gas feeders 165, 168, gas feed pipes 163, 166 and gas injectors 164, 167 are provided, while as the gas blowing mechanism for locally blowing a low absorption gas on the surface of the mirror 117, the gas feeder 170 and gas feed pipe 169 are provided.

Figure 4:
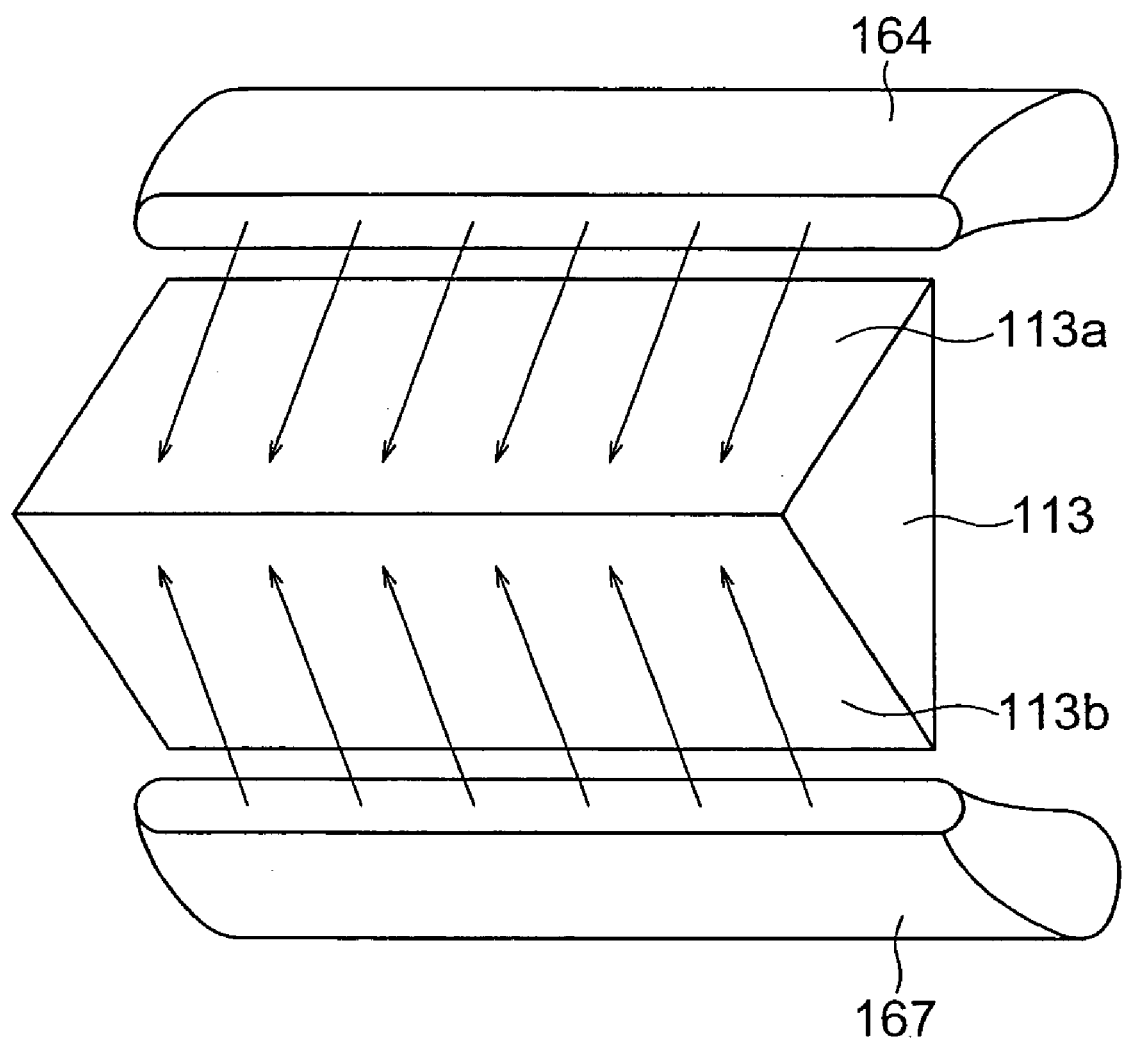
FIG. 4 is a view of the flow of low absorption gas near a V-block type mirror provided in a projection optical system according to a third embodiment of the present invention.

FIG. 4 is a view of the flow of the low absorption gas near the V-block type mirror 113. The low absorption gas fed from the gas injector 164 forms a gas flow at the vicinity of the mask side reflection surface 113a of the V-block type mirror 113, while the low absorption gas fed from the gas injector 167 forms a gas flow at the vicinity of the mask side reflection surface 113b. Gas flows following along the reflection surfaces 113a, 113b from the base side of the mirror 113 toward the ridge line are formed. Therefore, the reflection surfaces 113a, 113b of the mirror 113 come into less contact with the surrounding relatively high residual oxygen or water vapor concentration gas, and oxidation of the mirror 113 can be prevented. The same applies to the mirror 117.

Note that, in this third embodiment, a single type of gas is fed to the barrels 100, 101 of the projection optical system PL, so the gas feeders 162, 165, 168, 170 may also be combined into a single feeder.

Further, in this third embodiment, the low absorption gas was made helium, but when there is no need to positively cool the mirrors 113, 117, it may be nitrogen or another rare gas as well. Further, as in the first and second embodiments, it is possible to use a gas comprised of nitrogen or a rare gas in which a predetermined concentration of hydrogen is mixed so as to prevent oxidation of the mirrors 113, 117 better. Note that, the gas blowing mechanism in the third embodiment may also be applied to the first and second embodiments.

Further, as in this third embodiment, the method of locally blowing on the mirrors 113, 117 a low absorption gas to prevent their oxidation may also be applied to the lenses of the projection optical system PL and the optical elements (lenses or mirrors etc.) of an illumination optical system IL or beam matching unit BMU.

The gas feeder used in the above-mentioned first to third embodiments may include a gas tank from which it can be supplied with gas or may be supplied with gas from a gas pipe in a semiconductor plant. In either case, to raise the purity of the gas supplied to the light path, it is preferable to provide a filter for reducing the concentration of the oxygen or water vapor or other absorption gas or filter for removing dust and a temperature control mechanism for controlling the temperature to a predetermined temperature.

Figure 6:
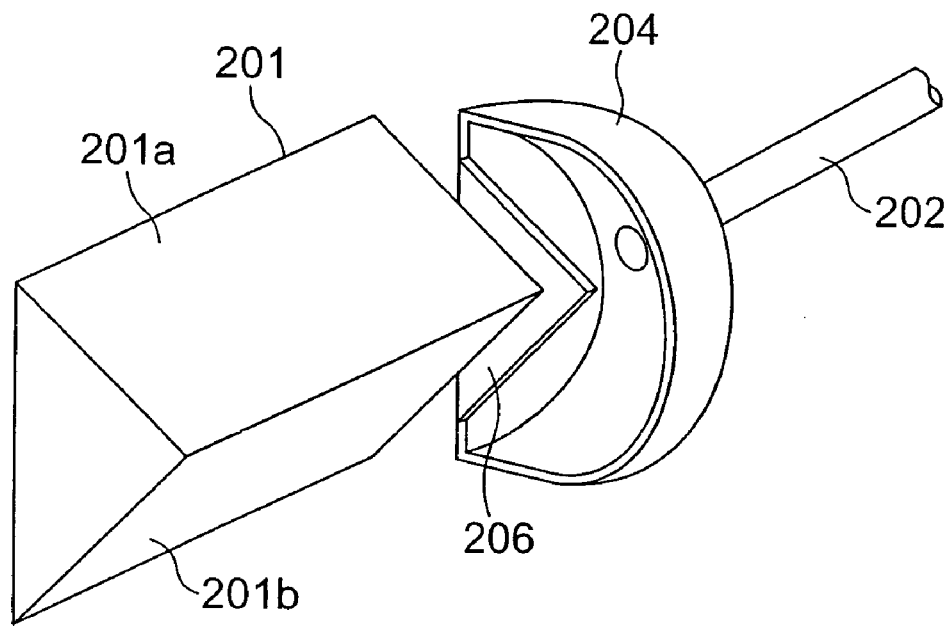
FIG. 6 is a perspective view of key parts of a configuration for feeding a low absorption gas to an optical element of a fourth embodiment of the present invention.

Next, a fourth embodiment of the present invention will be explained. FIG. 6 is a view showing key parts of another configuration for supplying the V-block type mirror used as the reflection optical element of the projection optical system employed in the projection exposure apparatus according to the present invention with a low absorption gas (purge gas) The overall configuration of the projection exposure apparatus, the configuration of the projection optical system, the gas feed mechanism, etc. are similar to those explained in the above-mentioned first to third embodiments, so their explanations will be omitted. The V-block type mirror 201 shown in FIG. 6 is an optical element corresponding to the V-block type mirror 113 in FIG. 3.

The gas blowing mechanism locally blowing low absorption gas to the surface of the V-block type mirror 113 shown in FIG. 3 and FIG. 4, as illustrated, causes a flow of low absorption gas from above and below along the reflection surfaces 113a, 113b. As opposed to this, the gas blowing mechanism in this embodiment, as shown in FIG. 6, blows low absorption gas from one of the directions perpendicular to the two side surfaces of the V-block type mirror 201, that is, the directions heading from the base to the ridge line of the mirror 201 through the gas feed pipe 202.

As shown in FIG. 6, the front end (feed port) of the gas feed pipe 202 arranged at the other of the two side faces of the V-block type mirror 201 is integrally provided with an attachment serving as a flow rectifying mechanism for slowing or making uniform the blown flow of gas. Here, an example of attachment of a gas feed hood (substantially funnel-shaped duct) 204 as the attachment is shown. By attaching such a gas feed hood 204, the cross-sectional area of the path of flow of the low absorption gas blown from the gas feed pipe 202 becomes larger, so along with this, the flow rate of the low absorption gas becomes lower. Therefore, the vicinity of the reflection surfaces 201a, 201b of the V-block type mirror 201 is filled statically with low absorption gas and entrainment of outside air with a relatively high residual oxygen or water vapor concentration can be reduced.

Figure 7:
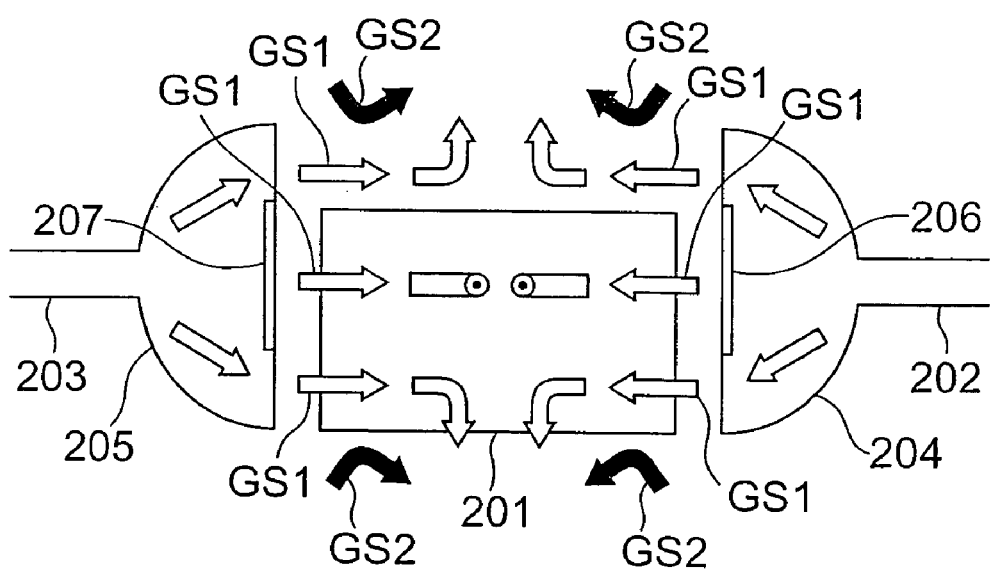
FIG. 7 is a view of key parts of a configuration for feeding a low absorption gas to an optical element of a fourth embodiment of the present invention.

As shown in FIG. 7, it is also possible to provide a gas feed pipe 203 and gas feed hood 205 configured the same as the gas feed pipe 202 and gas feed hood 204 at the other of the two side faces of the V-block type mirror 201. In this case, the gas feed hoods 204, 205 are preferably provided so that their opening parts (feed ports) face each other across the V-block type mirror 201. When providing such a gas feed pipe 202 and gas feed hood 204 at only one side of the V-block type mirror 201, the entrainment of the low absorption gas in the gas flow inevitably is low at the upstream side and becomes higher the further to the downstream side, so the drop in reflectance is liable to become greater the further to the downstream side.

As opposed to this, when providing the gas feed pipes 202, 203 and gas feed hoods 204, 205 at the two sides of the V-block type mirror 201, as shown in FIG. 7, the flows of the low absorption gas GS1 from both of the gas feed hoods 204, 205 collide with each other at the substantial center of the V-block type mirror 201 and head outward from the reflection surfaces 201a, 201b. Due to this, entrainment of outside air GS2 with a relatively high residual oxygen or water vapor concentration can be reduced over the entire reflection surfaces 201a, 201b and a drop in the reflectance of the reflection surfaces 201a, 201b of the V-block type mirror 201 or unevenness of reflectance can be further suppressed.

Note that here, the optical element supplied with the low absorption gas is the V-block type mirror 201, so as explained above, one set of the gas feed pipes 202, 203 and gas feed hoods 204, 205 is preferably provided near each of the two side faces, that is, a total of two sets, but in the case of an optical element such as a concave mirror, a further plurality (for example, 4, 6, 8) may also be provided. In this case, they are preferably arranged so that the feed ports of the low absorption gas become symmetric around the optical element concerned, that is, are arranged radially.

By attaching such gas feed hoods 204, 205 to the gas feed pipes 202, 203, the low absorption gas emerging from the openings of the gas feed hoods 204, 205 flows slowly, so it is possible to reduce the entrainment of outside air. The flow rate at the centers of the gas feed hoods 204, 205 (on extensions of gas feed pipes 202, 203) is high. The flow rate becomes lower the further to the peripheries. That is, the uniformity of the flow rate is not necessarily high. Therefore, entrainment of outside air with a relatively high residual oxygen or water vapor concentration may occur.

Therefore, in this embodiment, the openings of the gas feed hood 204, 205 are integrally provided with shield plates 206, 207 for partially shutting them. The shield plates 206, 207 are preferably provided so as to include the extension lines of the gas feed pipes 202, 203, that is, so as not to allow the relative fast flow rate part of the low absorption gas blown from the feed ports of the gas feed pipes 202, 203 to be directly blown from the openings of the gas feed hoods 204, 205. Due to this, the uniformity of the flow rate of the low absorption gas blown from the gas feed hoods 204, 205 becomes higher, and entrainment of outside air with a relatively high residual oxygen or water vapor concentration can be further reduced.

As the shapes of these shield plates 206, 207, taking note of the fact that the side faces of the V-block type mirror 201 are triangular, these were made triangular similar to the same. By making the shapes of the shield plates 206, 207 the same or similar to the cross-sectional shapes of the optical elements covered in the direction of flow of the low absorption gas, it is possible to produce a smooth flow following the reflection surfaces and entrainment of outside air with a relatively high residual oxygen or water vapor concentration can be prevented more.

Here, the attachments used as the flow rectifying mechanisms attached to the gas feed pipes 202, 203 for slowing or making uniform the flow of gas are not limited to those shown in FIG. 6 and FIG. 7. It is also possible to use the ones illustrated in FIG. 8 to FIG. 13.

Figure 8:
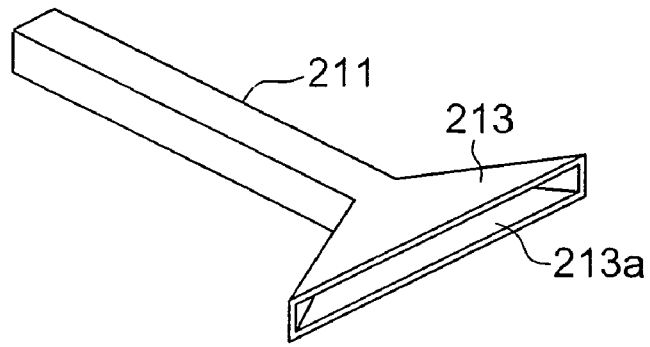
FIG. 8 is a perspective view of a configuration using a duct as an attachment provided at a feed port of a gas feed pipe of a fourth embodiment of the present invention.

FIG. 8 shows an attachment serving as a flow rectifying mechanism for slowing or making uniform a gas flow using a substantially funnel-shaped duct (hood) 213 (funnel type). This duct 213 is attached so that its downstream side expands wider at the feed port of the gas feed pipe 211. The shape of the opening 213a of the duct 213 is not limited to the rectangular shape illustrated and may be a circular shape, semicircular shape, square shape, or any other shape, but the shape is preferably selected from the configuration and shape of the optical element to be fed the low absorption gas, the feed direction of the low absorption gas, the number or arrangement of the feed ports, or other viewpoints.

Figure 9:
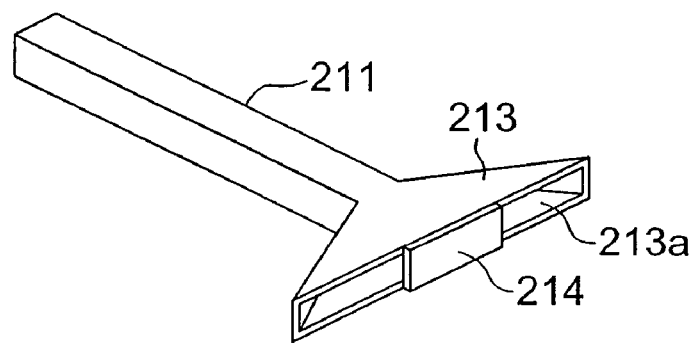
FIG. 9 is a perspective view of a configuration providing the duct of FIG. 8 with a shield plate.
Figure 10:
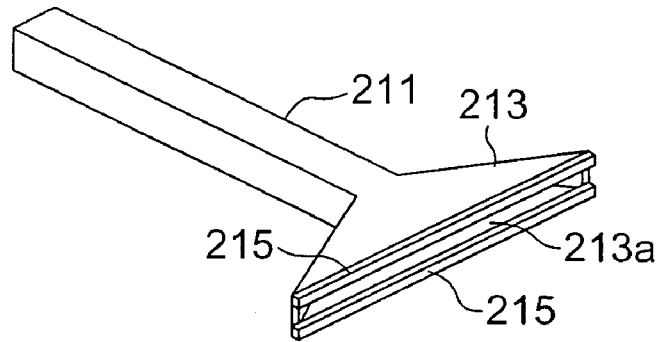
FIG. 10 is a perspective view of a configuration providing the duct of FIG. 8 with other shield plates.

The following FIG. 9 to FIG. 13 show improvements of the funnel type attachment shown in FIG. 8. FIG. 9 shows a rectangular shaped shield plate 214 integrally attached to the substantial center of the opening 213a of the duct 213 (shield plate type). FIG. 10 shows a pair of shield plates 215 bridging the longitudinal direction of the opening part 213a at the top and bottom of the opening 213a of the duct 213 (two side parts in the short direction of the opening 213a) (slit type). The shape of the shield plates 215 is not limited to that shown and maybe other shapes as well. It is preferably selected from the shape of the opening 213a of the duct 213, the configuration and shape of the optical element fed the low absorption gas, the direction of feed of the low absorption gas, the number and arrangement of the feed ports, and other viewpoints. For example, it may be considered to reduce the slit interval at the center and increase the slit interval the further from the center.

Figure 11:
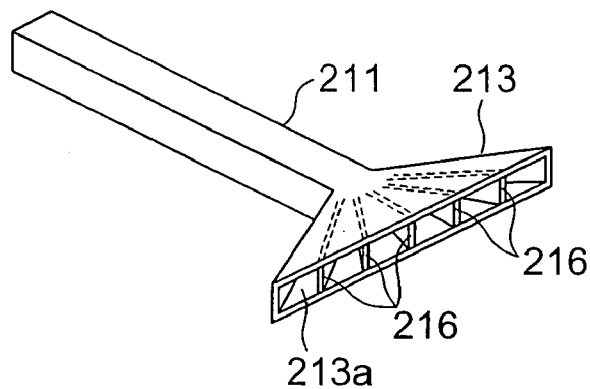
FIG. 11 is a perspective view of a configuration providing the duct of FIG. 8 with diffusion plates.

FIG. 11 shows the inside of the duct 213 integrally provided with a plurality of diffusion plates 216 in a radial manner in accordance with the wideness from the feed port of the gas feed pipe 211 to the opening 213a of the duct 213 (diffuser type). The low absorption gas blown from the feed port of the gas feed pipe 211 is guided by the diffusion plates 216 and blown out from the opening 213a. The flow of the low absorption gas is slowed by the widening of the duct 213, while the flow rate is made uniform by the diffusion plates 216. The number of the diffusion plates 216 is five in the figure, but is not limited to this. Further, the diffusion plates 216 maybe arranged equally in a radial fashion. However, the nearer to the center of extension line of the feed port of the gas feed pipe 211, the faster the flow rate, while the further outside, the slower, so considering this, it is preferable to design the pitch of arrangement of size (length) etc. so that the low absorption gas blown from the opening 213a of the duct 213 becomes uniform in flow rate as a whole.

Figure 12:
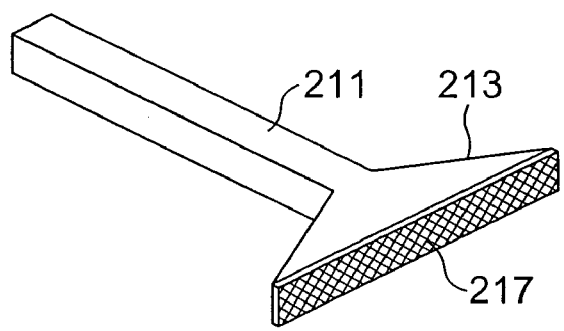
FIG. 12 is a perspective view of a configuration providing the duct of FIG. 8 with a mesh plate.

FIG. 12 shows the opening part 213a of the duct 213 shown in FIG. 8 covered entirely by attachment of a mesh plate 217 (mesh type). By attaching such a mesh plate as well, it is possible to improve the uniformity of the low absorption gas blown from the opening (mesh plate) of the duct. Note that, while not illustrated, instead of the mesh plate 217, a porous plate having a large number of through holes may also be attached to realize a similar effect.

Figure 13:
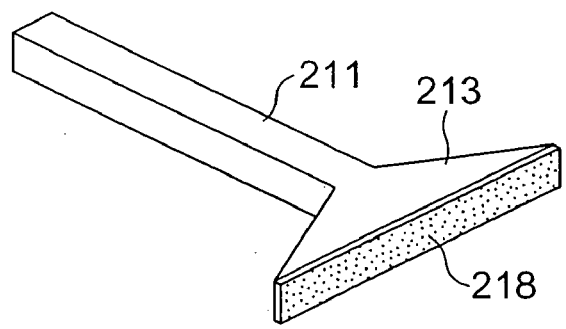
FIG. 13 is a perspective view of a configuration providing the duct of FIG. 8 with a filter plate.

FIG. 13 shows the opening 213a of the duct 213 shown in FIG. 8 covered entirely by attachment of a cleaning filter plate (here, the particle film plate) 218 (particle filter type). By attaching such a filter plate as well, it is possible to improve the uniformity of the low absorption gas blown from the opening 213a (filter plate 218) of the duct 213 and further possible to remove the particles included in the low absorption gas (dust, dirt, etc.)

Note that, in FIG. 12 and FIG. 13, the mesh plate 217 and filter plate 218 are attached at the opening 213a of the duct 213 shown in FIG. 8, but they may also be provided at the opening 213a (parts other than shield plates 214, 215) of the duct 213 of FIG. 9 and FIG. 10 or at the opening 213a of the duct 213 of FIG. 11. The gas feed pipe 211 shown in FIG. 8 to FIG. 13 need not be rectangular in cross-sectional shape and may also be circular, elliptical, polygonal, etc. in shape so long as being a pipe shape.

Figure 14:
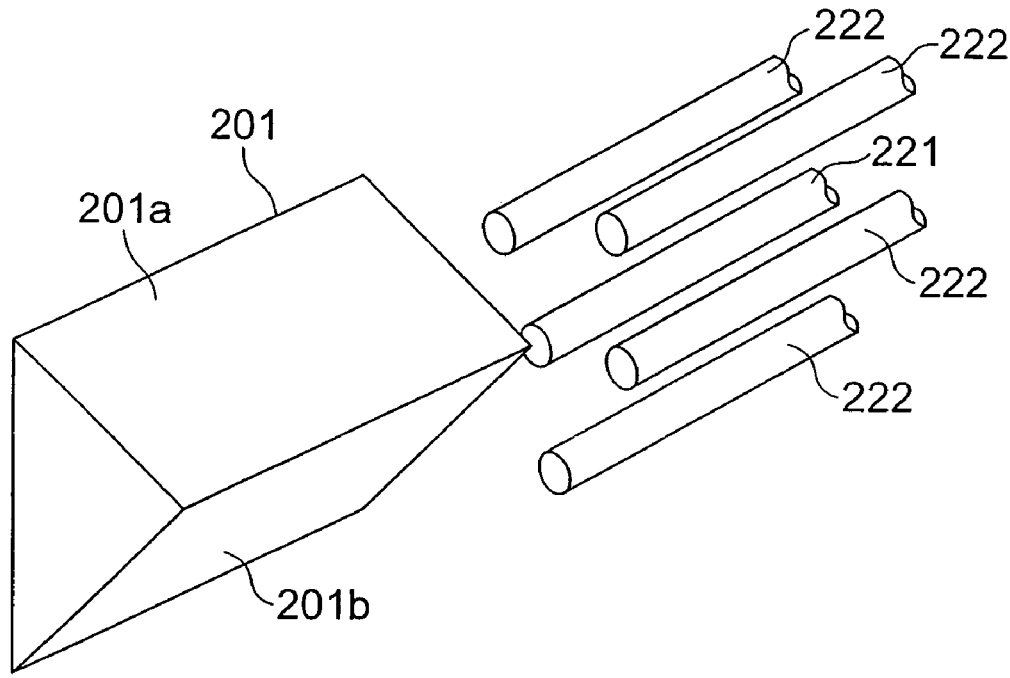
FIG. 14 is a view of key parts of a configuration for feeding a low absorption gas to an optical element of a fifth embodiment of the present invention.

Next, the configuration of a gas blowing mechanism in a fifth embodiment of the present invention will be explained using FIG. 14. In the above-mentioned fourth embodiment, a configuration providing the duct 213 was explained, but in this embodiment, as shown in FIG. 14, a main gas feed pipe 221 is provided near it with a plurality of auxiliary gas feed pipes 222 and low absorption gas is fed from the plurality of auxiliary intake pipes 222 so as to follow the low absorption gas blown from the main gas feed pipe 221.

By adopting this configuration, the V-block type mirror 201 is mainly supplied from the main gas feed pipe 221 with a low absorption gas, but substantially in parallel with this flow, low absorption gas flows from the auxiliary gas feed pipes 222, so what is entrained in the low absorption gas from the main gas feed pipe 221 is the low absorption gas fed from the auxiliary gas feed pipes 222—which is cleaner than the outside air with a relatively high residual oxygen or water vapor concentration. The low absorption gas from the auxiliary gas feed pipes 222 forms a barrier against the external outside air, so less outside air is entrained in the low absorption gas from the main gas feed pipe 221. Therefore, the vicinity of the reflection surfaces 201a, 201b of the V-block type mirror 201 is filled with low absorption gas, so it is possible to reduce the entrainment of outside air with a relatively high residual oxygen or water vapor concentration.

In this example, the low absorption gas blown from the auxiliary gas feed pipes 222 is made a gas the same as the low absorption gas blown from the main gas feed pipe 221. If making it the same gas in this way, it is possible to feed the auxiliary gas feed pipes 222 a low absorption gas branched off from the main gas feed pipe 221. This is convenient in design. However, it is also possible to feed a low absorption gas different from the low absorption gas blown from the main gas feed pipe 221 from the auxiliary gas feed pipes 222. In this case, the low absorption gas fed through the auxiliary gas feed pipes 222 may be one with a purity lower than the low absorption gas fed from the main gas feed pipe 221 (however, it must be of a purity sufficiently higher than the surrounding atmosphere). The flow rate or flow amount of the low absorption gas blown from the auxiliary gas feed pipes 222 may be the same as or higher or lower than the flow rate or flow amount of the low absorption gas blown from the main gas feed pipe 221, but the flow amount of the low absorption gas fed from the auxiliary gas feed pipes 222 may be lower than the flow amount of the low absorption gas fed from the main gas feed pipe 221.

Figure 15:
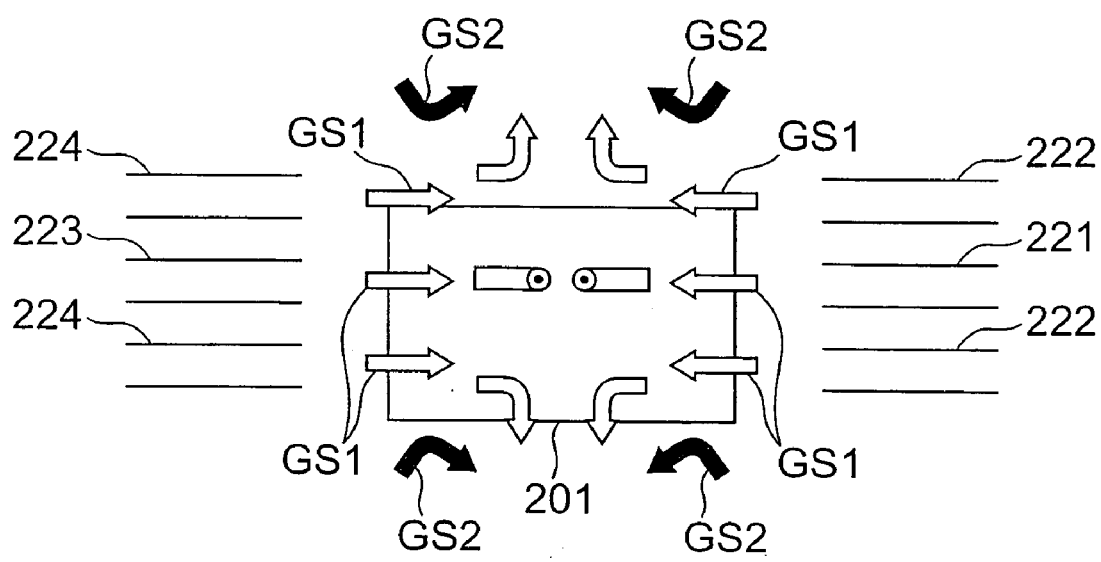
FIG. 15 is a view of key parts of a configuration for feeding a low absorption gas to an optical element of a fifth embodiment of the present invention.

As shown in FIG. 15, it is also possible to provide a main gas feed pipe 223 and auxiliary gas feed pipes 224 of configurations similar to the main gas feed pipe 221 and auxiliary gas feed pipes 222 at the other side of the two side surfaces of the V-block type mirror 201. In this case, the paired gas feed pipes 221, 222, 223, 224 are preferably provided with their opening (feed ports) straddling the V-block type mirror 201. When providing the main gas feed pipe 223 and auxiliary gas feed pipes 224 of configurations similar to the main gas feed pipe 221 and auxiliary gas feed pipes 222 at the other side of the two side surfaces of the V-block type mirror 201 as well, as shown in FIG. 15, the flows of low absorption gas GS1 from the main gas feed pipes 221, 223 and auxiliary gas feed pipes 222, 224 collide with each other at the substantial center of the V-block type mirror 201 and head from the reflection surfaces 201a, 201b to the outside (side moving away). Due to this, it is possible to further reduce the entrainment of outside air GS2 with a relatively high residual oxygen or water vapor concentration and possible to further suppress the drop in reflectance or the occurrence of uneven reflectance of the reflection surfaces 201a, 201b of the V-block type mirror 201.

Note that, here, the optical element supplied with the low absorption gas is the V-block type mirror 201, so as explained above, it is preferable to provide sets of the main gas feed pipes 221, 223 and auxiliary gas feed pipes 222, 224 at the two surfaces, that is, a total of two sets, but in the case of an optical element such as a concave mirror, it is also possible to provide a further plurality of sets (for example, 4 sets, 6 sets, 8 sets). In this case, it is preferable to arrange them so that the feed ports of the low absorption gas become symmetric about the optical element, that is, radial.

In the above-mentioned fifth embodiment, the explanation was given of the main gas feed pipes 221, 223 and auxiliary gas feed pipes 222, 224 not provided with the gas feed hood 204 shown in FIG. 6 and FIG. 7, the duct 213 shown in FIG. 8 to FIG. 13, but it is also possible to provide one or more (or all) of the main gas feed pipes 221, 223 and auxiliary gas feed pipes 222, 224 (or all) with the gas feed hood 204 shown in FIG. 6 and FIG. 7 or the duct 213 shown in FIG. 8 to FIG. 13. Due to this, a higher effect can be obtained.

Note that, in FIG. 7 or FIG. 15, the low absorption gas is supplied from both of the two side surfaces of the V-block type mirror 201, but it is also possible to supply the low absorption gas as explained above from one of the surfaces and not supply the low absorption gas from the other surface, but exhaust it. By configuring the apparatus in this way, the low absorption gas supplied from the one side surface of the V-block type mirror 201 flows along the reflection surfaces 201a, 201b and is exhausted from the other side, so the flow of the low absorption gas becomes smooth and entrainment of outside air with relatively a high residual oxygen or water vapor concentration can be reduced.

In the above-mentioned embodiments, the application of the present invention to a step-and-scan type reduction projection exposure apparatus was explained, but it is also possible apply the present invention to any other type of exposure apparatus such as a step-and-repeat type or step-and-stitch type reduction projection exposure apparatus or mirror projection aligner.

Further, the present invention can be applied not only to an exposure apparatus for producing a semiconductor device, but also an exposure apparatus used for the production of a liquid crystal display, plasma display, thin film magnetic head, image pickup device (CCD etc.), micromachine, DNA chip, etc., and an exposure apparatus for producing a reticle or mask by transferring circuit patterns to a glass substrate or silicon wafer. That is, the present invention can be applied without regard as to the exposure system or application etc. of the exposure apparatus.

As the exposure light source 1, in addition to the above, for example, it is possible to use a harmonic of a YAG laser or other solid laser having an oscillation spectrum at any of the wavelength of 193 nm, 157 nm, 146 nm, 126 nm. Further, it is also possible to use a harmonic obtained by amplifying a single wavelength laser of the infrared region or visible region emitted from a DFB semiconductor laser or fiber laser by for example an erbium (or both erbium and yttrium)-doped fiber amplifier and converting to in wavelength to ultraviolet light using a nonlinear optical crystal.

Further, the projection optical system is not limited to a reduction type. It may also be applied to an equal magnification type or enlargement type (for example, an exposure apparatus for making a liquid crystal display or plasma display). Further, the projection optical system may be any of a catoptric system, a catadioptric system, and a dioptric system.

The exposure apparatus of the above-mentioned embodiments can be produced by assembling an illumination optical system and projection optical system comprised of a plurality of optical elements (lenses, mirrors, etc.) into an exposure apparatus body and optically adjusting them and by assembling a reticle stage or wafer stage comprised of a large number of mechanical parts in the exposure apparatus body and connecting the wiring or piping, assembling in a laser interferometer or AF apparatus and optically adjusting it, connecting to the chambers, barrels, and space partitioning walls of the illumination optical system and projection optical system the purge gas feed apparatus and recovery apparatus through pipes, assembling an environment chamber having a separate air-conditioning apparatus, placing the exposure apparatus body in the environment chamber, and making overall adjustments (electrical adjustment, confirmation of operation, etc.) Note that the exposure apparatus is preferably produced in a clean room managed in temperature and cleanness.

Figure 16:
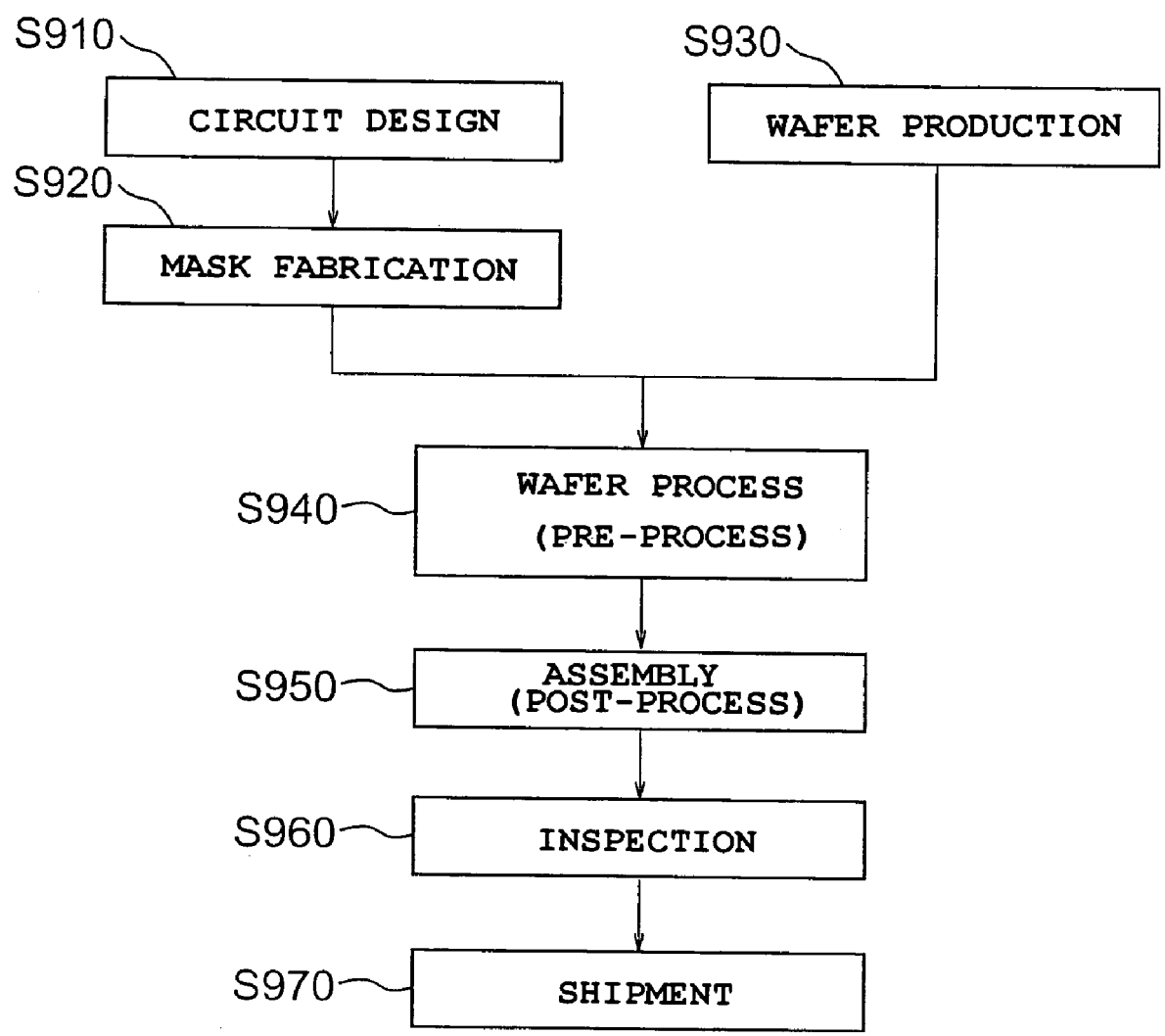
FIG. 16 is a flow chart of the production process of an electronic device.
Figure 17:
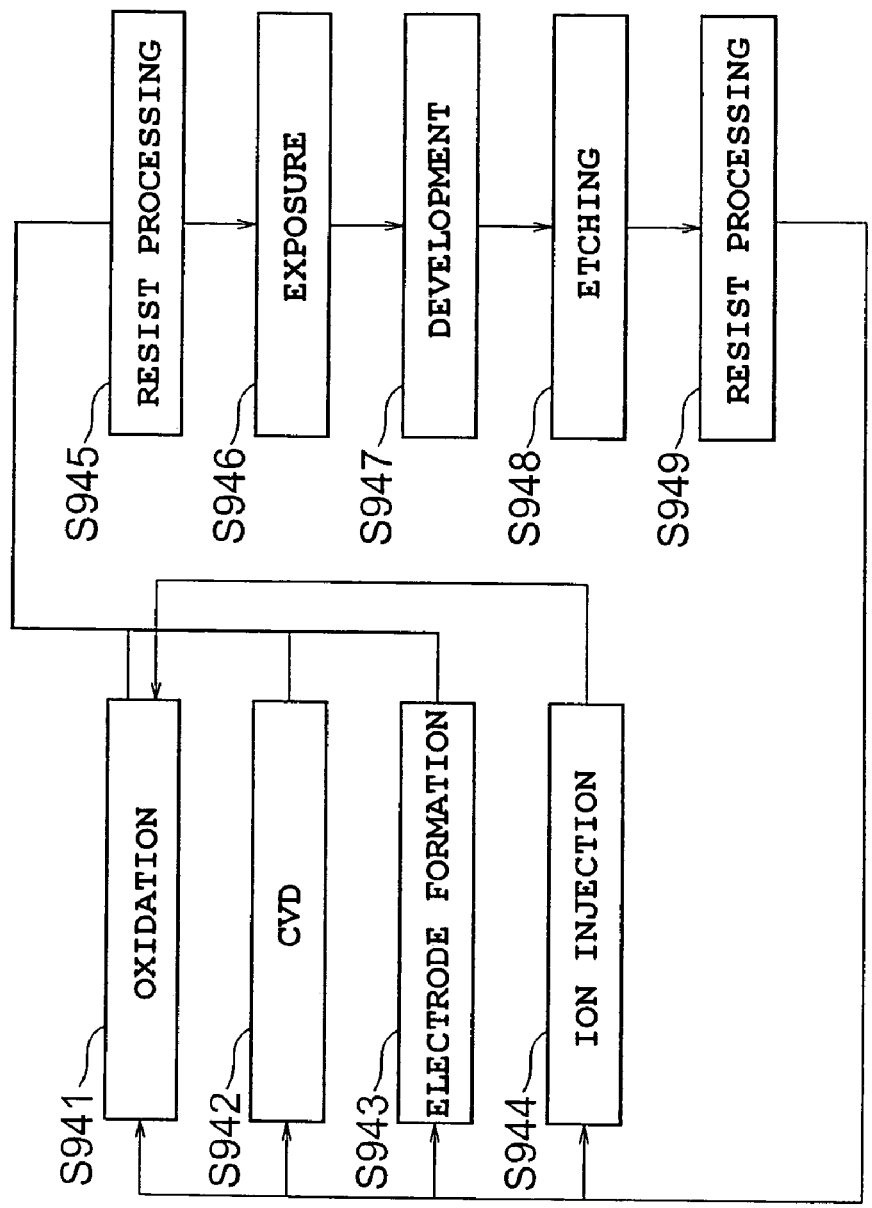
FIG. 17 is a flow chart of the processing in the wafer process of FIG. 16.

Next, the method of production of a device using the above-mentioned exposure apparatus in the lithography step will be explained with reference to FIG. 16 and FIG. 17. FIG. 16 and FIG. 17 are flow charts of the process of production of for example an IC or LSI or other semiconductor chip, liquid crystal panel, CCD, thin film magnetic head, micromachine, or other electronic device.

As shown in FIG. 16, in the process of production of an electronic device, first, the circuit of the electronic device is designed or other functions and performance of the device are designed (step S910), then the patterns for realizing these functions are designed and a mask formed with the designed circuit patterns is fabricated (step S920). At the same time, a silicon or other material is used to produce a wafer (silicon substrate) (step S930).

Next, the mask fabricated at step S920 and the wafer produced at step S930 are used to form actual circuits etc. on the wafer by lithography (step S940). Specifically, as shown in FIG. 17, first oxidation (step S941), CVD (step S942), electrodeformation (step S943), ion implantation (step S944), and other processing are performed to form on the wafer surface an insulation film, electrode interconnect film, semiconductor film, or other thin film. Next, this thin film is completely coated with a photoresist using a resist coater (step S945).

Next, this resist-coated substrate is loaded on a wafer holder of the exposure apparatus of the present invention and the mask produced at step S920 is loaded on a reticle holder and the patterns formed on the mask are reduced and transferred to the wafer (step S946). At this time, in the exposure apparatus, the shot areas of the wafer are successively positioned and the shot areas are successively transferred the patterns of the mask.

After the exposure ends, the wafer is unloaded from the wafer holder and developed using a developer (step S947). Due to this, the wafer surface is formed with resist images of the mask patterns.

Further, the developed wafer is etched using an etching apparatus (step S948) and the resist remaining on the wafer surface is removed using for example a plasma ashing apparatus etc. (step S949).

Due to this, the shot areas of the wafer are formed with insulating layers or patterns of the electrode interconnects etc. Further, by successively repeating the processing while changing the mask, the wafer is formed with the actual circuits etc.

After the wafer is formed with the circuits etc., as shown in FIG. 16, next the devices are assembled (step S950). Specifically, the wafer is diced to individual chips and the chips are attached to lead frames or packages, electrodes are connected by bonding, and the assemblies are sealed by resin or otherwise packaged. Further, operational confirmation tests, endurance tests, and other inspections of the produced devices are carried out (step S960) and the results shipped out as finished devices (step S970).

Note that, the present invention is not limited to the above-mentioned embodiments and may of course be modified in various ways within the scope of the present invention.

According to the present invention, there is the effect that it is possible to provide a highly durable projection exposure apparatus able to suppress deterioration of the optical properties of optical elements (reflectance of reflection mirrors or transmittance of antireflection coating of lenses etc.) and possible to maintain the initial performance over a long period even when using vacuum ultraviolet light as a light source in the exposure apparatus.

Further, there is also the effect that it is possible to provide a projection exposure apparatus able to prevent pickup of heat by an optical element due to exposure light and exhibit stable optical performance.

The present disclosure relates to subject matter contained in Japanese Patent Application No. 2002-169496, filed on Jun. 11, 2002, the disclosure of which is expressly incorporated herein by reference in its entirety.

The invention claimed is:

1. An exposure apparatus using an exposure light beam to illuminate a mask and transferring an image of a pattern on the mask onto a substrate, the exposure apparatus comprising:
   an optical element disposed in a space through which the exposure light beam passes and having a metal layer or a layer mainly comprised of metal on a surface of the optical element; and
   a gas feed unit which supplies the space with a gas mainly comprised of an inert gas or a rare gas and introduces a small amount of hydrogen into the gas to prevent oxidation of the metal layer or the layer mainly comprised of metal.

2. An exposure apparatus according to claim 1, further comprising:
an illumination optical system which illuminates the mask with the exposure light beam; and
a projection optical system which projects the image of the pattern onto the substrate,
wherein the optical element is provided in at least one of the illumination optical system and the projection optical system.

3. An exposure apparatus according to claim 1, further comprising:
an illumination optical system which illuminates the mask with the exposure light beam; and
a projection optical system which projects the image of the pattern onto the substrate;
wherein at least one of the illumination optical system and the projection optical system has a plurality of mutually independent spaces, and
the optical element is provided in a specific space among the plurality of spaces.

4. An exposure apparatus according to claim 1, wherein a concentration of the hydrogen gas is a partial pressure ratio of not more than about 10%.

5. An exposure apparatus according to claim 1, wherein the metal layer functions as a mirror reflecting the exposure light beam.

6. An exposure apparatus according to claim 1, wherein the layer mainly comprised of metal functions to prevent reflection, and the optical element having the layer mainly comprised of metal is a lens through which the exposure light beam passes.

7. An exposure apparatus using an exposure light beam to illuminate a mask and transferring an image of a pattern on the mask onto a substrate, the exposure apparatus comprising:
a chamber that houses a plurality of optical elements;
a gas feed unit that is connected to the chamber and supplies an inside of the chamber with a gas mainly comprised of an inert gas or a rare gas; and
a blowing unit which is provided in the chamber and locally blows the gas on a an optical element having a metal layer or a layer mainly comprised of metal on a surface of the optical element among the plurality of optical elements.

8. An exposure apparatus according to claim 7, wherein the blowing unit forms a flow for the optical element different from a flow of the gas due to the gas feed unit.

9. An exposure apparatus according to claim 7, further comprising a flow rectifying unit provided at a gas feed port of the blowing unit which slows or makes uniform the flow of gas blown from the gas feed port.

10. An exposure apparatus according to claim 7, further comprising an auxiliary blowing unit which feeds the gas so as to follow the flow of gas blown from a gas feed port of the blowing unit.

11. An exposure apparatus according to claim 10, wherein at least one of the gas feed port of the blowing unit and a gas feed port of the auxiliary blowing unit has a flow rectifying unit which slows or makes uniform the flow of gas fed from the gas feed port.

12. An exposure apparatus according to claim 9, wherein the flow rectifying unit has a plate member attached around a periphery of the gas feed port and facing the outside.

13. An exposure apparatus according to claim 9, wherein the flow rectifying unit has a substantially funnel-shaped duct part attached so that its downstream side flares open at the gas feed port.

14. An exposure apparatus according to claim 13, further comprising a shield plate so as to shield part of an opening of the duct part.

15. An exposure apparatus according to claim 13, further comprising a plurality of diffusion plates which rectifies a flow of gas inside the duct part.

16. An exposure apparatus according to claim 13, further comprising a mesh plate at an opening of the duct part.

17. An exposure apparatus according to claim 13, further comprising a porous plate having a plurality of through holes at an opening of the duct part.

18. An exposure apparatus according to claim 13, further comprising a cleaning filter plate at an opening of the duct part.

19. An exposure apparatus according to claim 7, wherein the blowing unit includes a plurality of gas feed ports facing the optical element.

20. An exposure apparatus according to claim 7, further comprising an exhaust unit having a gas exhaust port at a position substantially symmetric with a gas feed port of the blowing unit across the optical element.

21. An exposure apparatus according to claim 7, further comprising:
an illumination optical system which illuminates the mask with the exposure light beam and
a projection optical system which projects the image of the pattern onto the substrate,
wherein the optical element is a reflection optical element provided in at least one of the illumination optical system and the projection optical system and reflects the exposure light beam.

22. An exposure apparatus according to claim 7, wherein the gas includes a predetermined concentration of hydrogen.

23. An exposure apparatus according to claim 7, wherein the gas supplied to the light path space is an inert gas.

24. A production method of an electronic device including a lithography step, wherein
the lithography step uses an exposure apparatus according to claim 7 to transfer a pattern formed on a mask onto a substrate.

25. An exposure apparatus using an exposure light beam to illuminate a mask and transferring an image of a pattern on the mask onto a substrate, the exposure apparatus comprising:
a projection optical system that is disposed between the mask and the substrate and that includes a plurality of optical elements including a reflection optical element having a metal layer or a layer mainly comprised of metal on a surface of the reflection optical element;
a barrel that houses the projection optical system;
a partition member that is disposed in the barrel and partitions a space in the barrel into a first space including the reflection optical element and a second space not including the reflection optical element;
a first gas feed unit which is connected to the barrel, feeds to the first space a first gas mainly comprised of an inert gas or a rare gas, and introduces into the gas a small amount of hydrogen to prevent oxidation of the metal layer or the layer mainly comprised of metal; and
a second gas feed unit which is connected to the barrel and feeds to the second space a second gas different from the first gas with respect to a main component of the first and second gases.

26. An exposure apparatus according to claim 25, wherein a feed amount of the first gas to the first space and a feed amount of the second gas to the second space are different.

27. An exposure apparatus according to claim 25, wherein the main ingredients of the first gas and the second gas are different.

28. A production method of an electronic device including a lithography step, wherein
    the lithography step uses an exposure apparatus according to claim 25 to transfer a pattern formed on a mask onto a substrate.

29. An exposure method using an exposure light beam to illuminate a mask and transferring an image of a pattern on the mask onto a substrate, the exposure method comprising:
    feeding a light path space through which the exposure light beam passes and in which is disposed an optical element having a metal layer or a layer mainly comprised of metal on a surface of the optical element, a gas mainly comprised of an inert gas or a rare gas; and
    introducing a small amount of hydrogen into the gas to prevent oxidation of the metal layer or the layer mainly comprised of metal.

30. An exposure method using an exposure light beam to illuminate a mask and transferring a pattern on the mask onto a substrate, the exposure method comprising:
    feeding a light path space through which the exposure light beam passes a gas mainly comprised of an inert gas or a rare gas; and
    locally blowing the gas to a surface of an optical element having a metal layer or a layer mainly comprised of metal among a plurality of optical elements arranged in the light path space.

31. An exposure method using an exposure light beam to illuminate a mask and transferring a pattern on the mask onto a substrate through a projection optical system, the exposure method comprising:
    partitioning a space in a barrel housing the projection optical system into a first space including a reflection optical element and a second space not including the reflection optical element;
    feeding the first space a first gas mainly comprised of an inert gas or a rare gas;
    introducing into the first gas a small amount of hydrogen to prevent oxidation of a metal layer or a layer mainly comprised of metal disposed on a surface of the reflection optical element; and
    feeding the second space a second gas different from the first gas with respect to a main component of the first and second gases.

32. An exposure method using an exposure light beam to illuminate a mask and transferring a pattern on the mask onto a substrate, the exposure method comprising:
    feeding a first gas mainly comprised of an inert gas or a rare gas to a light path space through which the exposure light beam passes; and
    exposing the substrate while blowing a second gas including a small amount of hydrogen to at least an optical element in an atmosphere supplied with the first gas, the optical element being disposed in the light path space and including a metal layer or a layer mainly comprised of metal on a surface of the optical element.

33. A production method of an electronic device including a lithography step, wherein
    the lithography step uses an exposure apparatus according to claim 1 to transfer a pattern formed on a mask onto a substrate.

* * * * *